US010109578B2

(12) United States Patent
Takekida

(10) Patent No.: US 10,109,578 B2
(45) Date of Patent: Oct. 23, 2018

(54) SEMICONDUCTOR MEMORY DEVICE

(71) Applicant: Toshiba Memory Corporation, Minato-ku (JP)

(72) Inventor: Hideto Takekida, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 18 days.

(21) Appl. No.: 15/463,718

(22) Filed: Mar. 20, 2017

(65) Prior Publication Data
US 2018/0076130 A1 Mar. 15, 2018

Related U.S. Application Data

(60) Provisional application No. 62/393,261, filed on Sep. 12, 2016.

(51) Int. Cl.
*H01L 23/522* (2006.01)
*H01L 27/11582* (2017.01)
*H01L 23/532* (2006.01)
*H01L 27/11573* (2017.01)

(52) U.S. Cl.
CPC .... *H01L 23/5226* (2013.01); *H01L 27/11582* (2013.01); *H01L 23/53266* (2013.01); *H01L 27/11573* (2013.01)

(58) Field of Classification Search
CPC ......... H01L 27/11565; H01L 27/11519; H01L 27/11524
See application file for complete search history.

(56) References Cited

U.S. PATENT DOCUMENTS

| 9,397,046 B1* | 7/2016 | Sharangpani ....... H01L 27/1157 |
| 9,406,692 B2* | 8/2016 | Lee ................... H01L 27/11575 |
| 2011/0291172 A1 | 12/2011 | Hwang et al. |
| 2012/0098050 A1 | 4/2012 | Shim et al. |
| 2015/0221667 A1 | 8/2015 | Fukuzumi et al. |
| 2016/0240552 A1* | 8/2016 | Arai .................. H01L 27/11582 |

FOREIGN PATENT DOCUMENTS

| JP | 2012-94869 | 5/2012 |
| JP | 2015-149413 | 8/2015 |

* cited by examiner

*Primary Examiner* — Jonathan Han
(74) *Attorney, Agent, or Firm* — Oblon, McClelland, Maier & Neustadt, L.L.P.

(57) ABSTRACT

According to one embodiment, a semiconductor memory device includes a substrate, a stacked body, a plurality of columnar portions, and an interconnect portion. The interconnect portion is provided in the stacked body and extends in a stacking direction of a plurality of electrode layers and a first direction crossing the stacking direction. The interconnect portion includes a first portion located in a first region of the stacked body that the plurality of columnar portions is provided and a second portion located in a second region of the stacked body adjacent to the first region in the first direction, the first portion having a first width, the second portion having a second width larger than the first width.

20 Claims, 19 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/393,261 filed on Sep. 12, 2016; the entire contents of which are incorporated herein by reference.

FIELD

Embodiments described herein relate generally to a semiconductor memory device

BACKGROUND

A three-dimensional structure memory device is proposed in which memory holes are formed in a stacked body of a plurality of electrode layers on a substrate, and in which a charge storage film and a channel extending in the stacked direction of the electrode layers are provided in the memory holes. The electrode layers are formed by a metal material being buried in the stacked body via slits, etc. Thereafter, interconnect portions are formed in the slits, and the substrate and the interconnect portions are electrically connected.

BRIEF DESCRIPTION OF THE DRAWINGS

FIG. 5A and FIG. 5B, FIG. 6A and FIG. 6B, FIG. 7, and FIG. 8A and FIG. 8B to FIG. 15A and FIG. 15B are each a view showing a method for manufacturing the semiconductor memory device according to the first embodiment;

DETAILED DESCRIPTION

Figure 1:
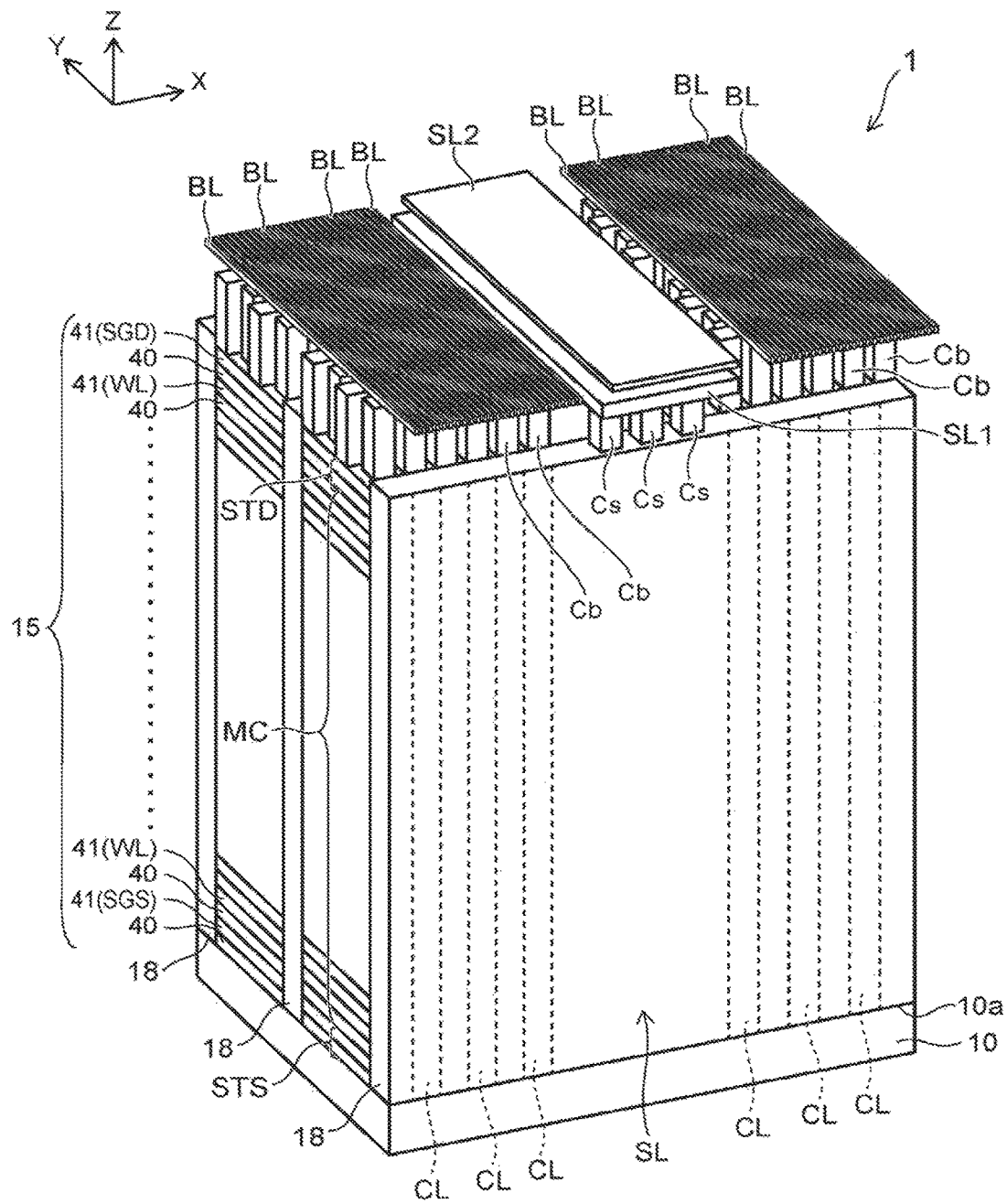
FIG. 1 is a perspective view showing a semiconductor memory device according to a first embodiment.

According to one embodiment, a semiconductor memory device includes a substrate, a stacked body, a plurality of columnar portions, and an interconnect portion. The stacked body is provided on the substrate and includes a plurality of electrode layers separately stacked each other. The plurality of columnar portions is provided in the stacked body, and each of the plurality of columnar portions includes a semiconductor portion extending in a stacking direction of the plurality of electrode layers and a charge storage film provided between the semiconductor portion and the stacked body. The interconnect portion is provided in the stacked body and extends in the stacking direction and a first direction crossing the stacking direction. The interconnect portion includes a first portion located in a first region of the stacked body that the plurality of columnar portions is provided and a second portion located in a second region of the stacked body adjacent to the first region in the first direction, the first portion having a first width, the second portion having a second width larger than the first width.

Hereinafter, embodiments will be described with reference to the drawings. Incidentally, in the respective drawings, the same elements are denoted by the same reference numerals.

First Embodiment

FIG. 1 is a perspective view showing a semiconductor memory device 1 according to a first embodiment.

As shown in FIG. 1, in the semiconductor memory device 1, a substrate 10 is provided. The substrate 10 contains, for example, silicon (Si).

Incidentally, in the specification, two directions parallel to an upper surface 10a of the substrate 10 and also orthogonal to each other are referred to as X-direction and Y-direction, and a direction orthogonal to both X-direction and Y-direction is referred to as Z-direction.

The semiconductor memory device 1 includes a stacked body 15, a columnar portion CL, and an interconnect portion 18. The stacked body 15 is provided on the substrate 10. The stacked body 15 includes a plurality of electrode layers 41 and a plurality of insulating layers 40. In the plurality of electrode layers 41, the electrode layer 41 located in a lowermost layer is a source-side selection gate SGS and is provided on the substrate 10 through the insulating layer 40. In the plurality of electrode layers 41, the electrode layer 41 located in an uppermost layer is a drain-side selection gate SGD. In the plurality of electrode layers 41, the electrode layers 41 provided between the electrode layer 41 which is the lowermost layer (source-side selection gate SGS) and the electrode layer 41 which is the uppermost layer (drain-side selection gate SGD) are word lines WL. The number of stacked electrode layers 40 is arbitrary. A plurality of source-side selection gates SGS and a plurality of drain-side selection gates SGD may be formed.

The insulating layer 40 is provided between the respective electrode layers 41. The insulating layer 40 contains, for example, silicon oxide (SiO).

At a crossing portion between the source-side selection gate SGS and the columnar portion CL, a source-side selection transistor STS is formed, and at a crossing portion between the drain-side selection gate SGD and the columnar portion CL, a drain-side selection transistor STD is formed. Further, at a crossing portion between the word line WL and the columnar portion CL, a memory cell MC is formed.

In the source-side selection transistor STS, the source-side selection gate SGS functions as a gate, and in the drain-side selection transistor STD, the drain-side selection gate SGD functions as a gate. Further, in the memory cell MC, the word line WL functions as a gate, and a part of the columnar portion CL functions as a channel. A plurality of memory cells MC is connected in series through the columnar portion CL between the source-side selection transistor STS and the drain-side selection transistor STD.

A plurality of columnar portions CL is provided in the stacked body 15. The columnar portions CL extend in the Z-direction in the stacked body 15.

On an upper side of the columnar portions CL, a plurality of bit lines BL extending in the Y-direction is provided. The bit lines BL are located on an upper side of the stacked body 15. The bit lines BL are connected to the columnar portions CL through contact portions V1 and Cb. In the contact portion Cb, an upper end thereof is connected to the contact portion V1, and a lower end thereof is connected to the columnar portion CL. The contact portion Cb is formed of a conductor such as a metal. Incidentally, in FIG. 1, illustration of the contact portion V1 is omitted.

A plurality of interconnect portions 18 is provided in the stacked body 15. The plurality of interconnect portions 18 is disposed spaced from each other along the Y-direction, and extends in the Z-direction and X-direction in the stacked body 15. A lower end of the interconnect portion 18 is in contact with the substrate 10.

On an upper side of the interconnect portions 18, a lower layer source line SL1 and an upper layer source line SL2, each extending in the Y-direction are provided. The lower layer source line SL1 is connected to the interconnect portions 18 through contact portions Cs. In the contact portion Cs, an upper end thereof is connected to the lower layer source line SL1, and a lower end thereof is connected to the interconnect portions 18. The contact portion Cs is formed of a conductor such as a metal.

The upper layer source line SL2 is connected to the lower layer source line SL1 through a contact (not shown). For example, the upper layer source line SL2 is located in the same layer as the bit lines BL.

By the interconnect portions 18, the lower layer source line SL1, and the upper layer source line SL2, a source line SL is formed.

Figure 2:
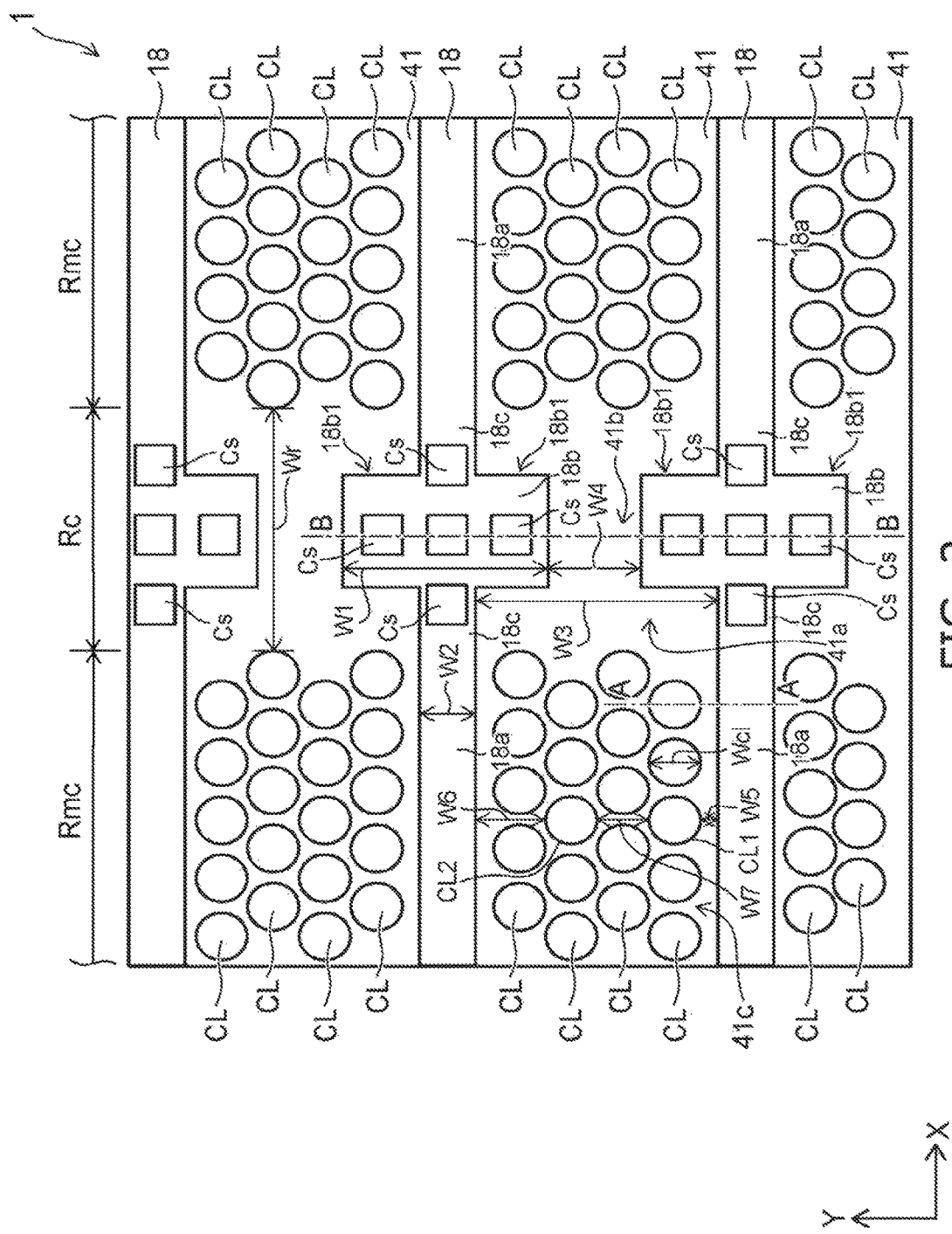
FIG. 2 is a plan view showing the semiconductor memory device according to the first embodiment.
Figure 3:
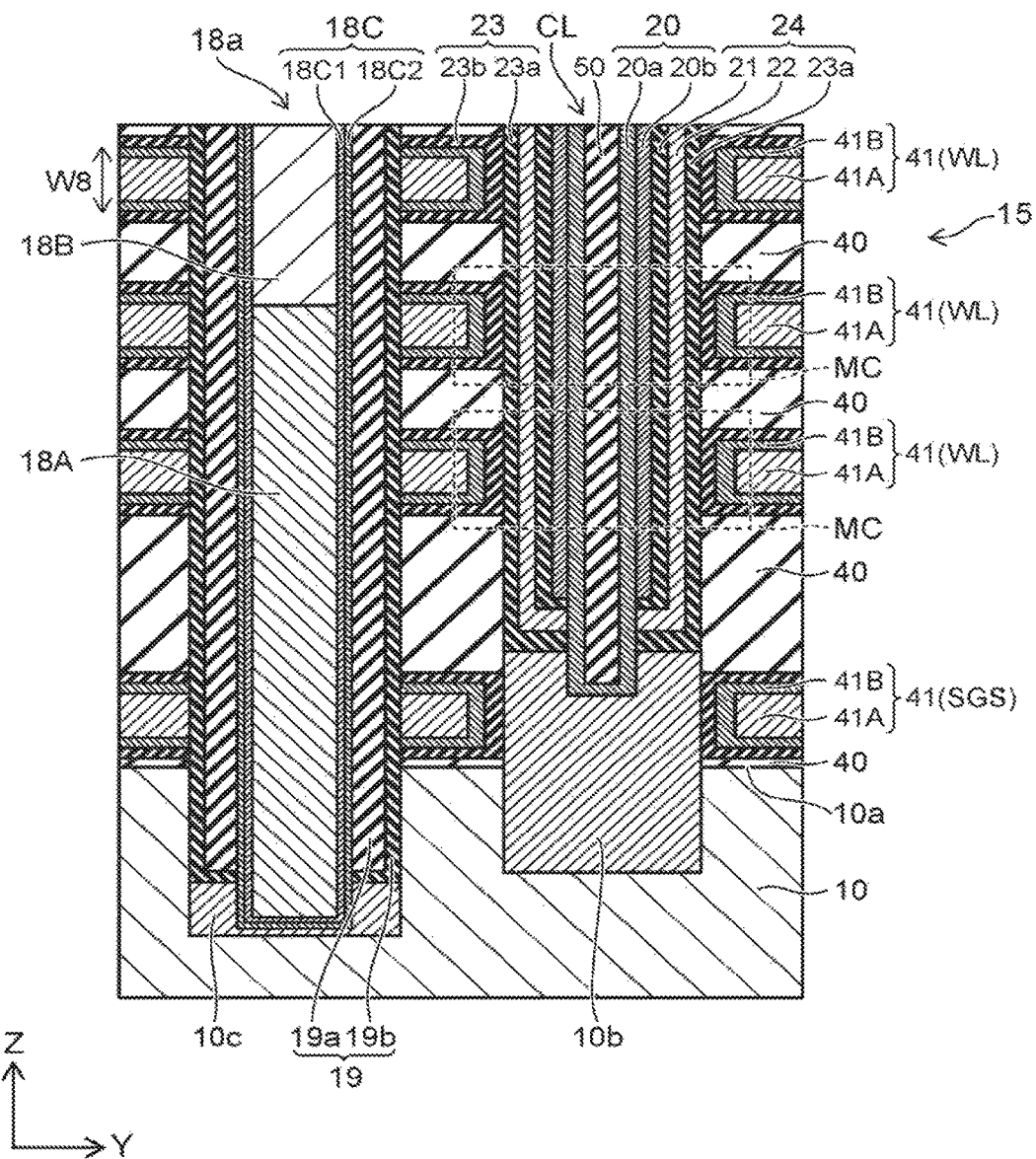
FIG. 3 is a sectional view taken along a line A-A of FIG. 2.
Figure 4A:
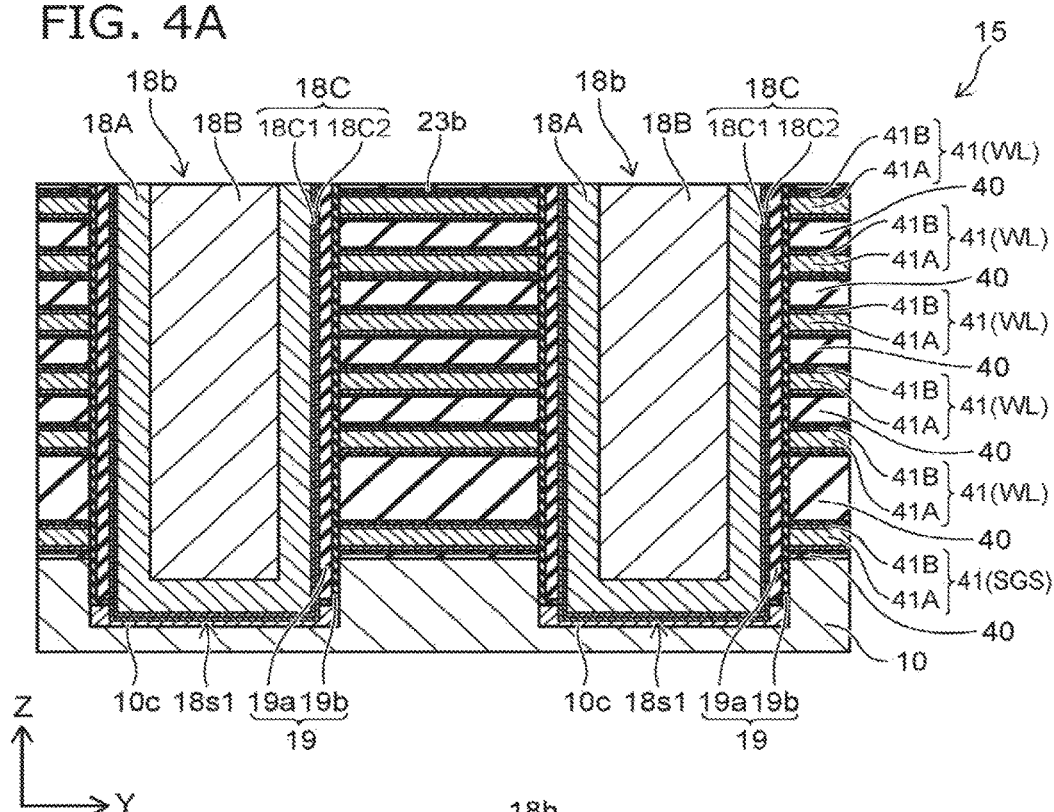
FIG. 4A is a sectional view taken along a line B-B of FIG. 2.
Figure 4B:
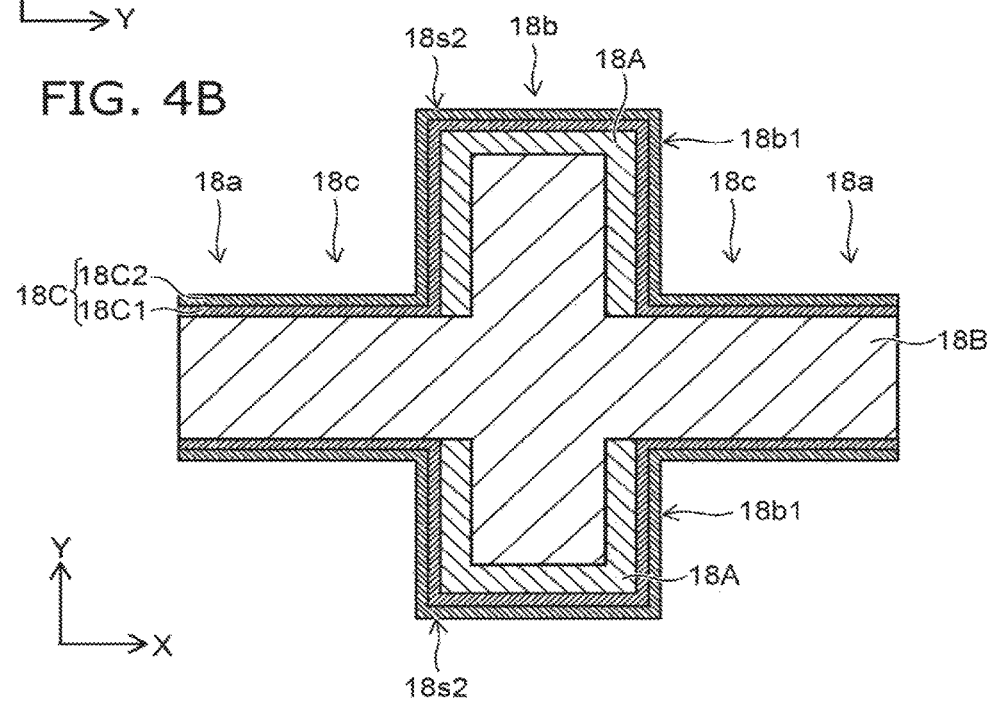
FIG. 4B is a plan view showing a part of the semiconductor memory device according to the first embodiment.

FIG. 2 shows a plane in which the electrode layer 41 of the stacked body 15 is extracted. FIG. 3 and FIG. 4A are cross sections taken along the line A-A and the line B-B of FIG. 2, respectively, and each show a cross section of lower layers of the stacked body 15. FIG. 4B shows a part of the interconnect portion 18 in FIG. 2.

As shown in FIG. 2, in the semiconductor memory device 1, a memory cell region Rmc and a contact region Rc are provided. The contact region Rc is arranged contiguous to the memory cell region Rmc in the X-direction. For example, the memory cell region Rmc and the contact region Rc are alternately arranged along the X-direction. For example, a width Wr in the X-direction of the contact region Rc is approximately 400 nm.

The stacked body 15 is provided in the memory cell region Rmc and the contact region Rc.

As shown in FIG. 3, the electrode layer 41 of the stacked body 15 includes a main body portion 41A and a peripheral portion 41B. The main body portion 41A contains, for example, a metal such as tungsten (W). The peripheral portion 41B is a barrier metal layer which covers a surface of the main body portion 41A. The peripheral portion 41B contains, for example, titanium nitride (TiN).

As shown in FIG. 2, the columnar portions CL are provided in the memory cell region Rmc. The columnar portions CL are formed, for example, in a circular columnar shape or an elliptical columnar shape. The columnar portion CL is not provided in the contact region Rc.

As shown in FIG. 3, the columnar portion CL includes a core portion 50, a channel 20, and a memory film 24. The core portion 50 contains, for example, silicon oxide. A shape of the core portion 50 is, for example, a circular columnar shape. On an upper end of the core portion 50, a contact plug (not shown) formed of polysilicon or the like is provided. A periphery of the contact plug is surrounded by the channel 20, and an upper end thereof is connected to the contact portion Cb.

The channel 20 is provided around the core portion 50. The channel 20 is a semiconductor portion and includes a body 20a and a cover layer 20b. A shape of the body 20a is, for example, a bottomed cylindrical shape. The cover layer 20b is provided around the body 20a. A shape of the cover layer 20b is, for example, a cylindrical shape.

The body 20a and the cover layer 20b contain silicon, for example, polysilicon obtained by crystallization of amorphous silicon.

A lower end of the channel 20 is in contact with the substrate 10. For example, the body 20a of the channel 20 is in contact with a connection member 10b formed in the substrate 10. The connection member 10b is a member formed over an inner portion of the stacked body 15 from an inner portion of the substrate 10, and is a member formed by, for example, epitaxially growing silicon.

The memory film 24 is provided around the channel 20. The memory film 24 includes a tunnel insulating film 21, a charge storage film 22, and an insulating film 23a. The tunnel insulating film 21 is provided around the channel 20. The tunnel insulating film 21 contains, for example, silicon oxide. A shape of the tunnel insulating film 21 is, for example, a cylindrical shape.

The charge storage film 22 is provided around the tunnel insulating film 21. The charge storage film 22 contains, for example, silicon nitride (SiN). A shape of the charge storage film 22 is, for example, a cylindrical shape. At a crossing portion between the channel 20 and the word line WL, a memory cell MC including the charge storage film 22 is formed.

The tunnel insulating film 21 is a potential barrier between the charge storage film 22 and the channel 20. In the tunnel insulating film 21, when a charge moves from the channel 20 to the charge storage film 22 (writing operation), and when a charge moves from the charge storage film 22 to the channel 20 (erasing operation), the charge tunnels.

The charge storage film 22 has a trap site which traps a charge in the film. A threshold of the memory cell MC changes depending on the presence or absence of a charge trapped by the trap site, and the amount of a trapped charge. Thereby, the memory cell MC holds information.

The insulating film 23a is provided around the charge storage film 22. The insulating film 23a contains, for example, silicon oxide. The insulating film 23a protects, for example, the charge storage film 22 from etching when forming the electrode layer 41.

On an outside of the insulating film 23a, an insulating film 23b is provided. The insulating film 23b is located between the insulating film 23a and the electrode layer 41, and between the insulating layer 40 and the electrode layer 41. The insulating film 23b contains, for example, aluminum oxide (AlO). By the insulating films 23a and 23b, a block insulating film 23 is formed.

As shown in FIG. 2, the interconnect portion 18 is provided in the memory cell region Rmc and the contact region Rc, and extends in the X-direction. The interconnect portion 18 includes a plate-shaped portion 18a, a wide portion 18b, and a connection portion 18c.

The plate-shaped portion 18a is located in the memory cell region Rmc, and the wide portion 18b and the connection portion 18c are located in the contact region Rc. The wide portion 18b is located between the connection portions 18c, and the connection portion 18c is located between the plate-shaped portion 18a and the wide portion 18b. The connection portion 18c may not be provided in the contact region Rc, and in this case, the interconnect portion 18 is formed of the plate-shaped portion 18a and the wide portion 18b.

The wide portion 18b is a portion having a width which expands in the Y-direction of the interconnect portion 18 as compared with the plate-shaped portion 18a and the connection portion 18c. The wide portion 18b includes at least one convex portion 18b1 protruding from the connection portion 18c. In an example shown in FIG. 2, the wide portion 18b includes two convex portions 18b1 protruding to both sides of the Y-direction. In this case, in the interconnect portions 18 disposed adjacent to each other in the Y-direction, the convex portion 18b1 provided in one interconnect portion 18 may face the convex portion 18b1 provided in the other interconnect portion 18

A shape of the convex portion 18b1 is, for example, a rectangular parallelepiped shape. An outer rim of the convex portion 18b1 may have an arc.

A width W1 in the Y-direction of the wide portion 18b is larger than a width W2 in the Y-direction of the plate-shaped portion 18a. The width W1 in the Y-direction of the wide portion 18b is larger than a width in the Y-direction of the connection portion 18c. The width in the Y-direction of the connection portion 18c is substantially the same as the width W2 in the Y-direction of the plate-shaped portion 18a.

In the contact region Rc, the wide portion 18b is provided in the interconnect portion 18, and therefore, the electrode layer 41 includes electrode portions 41a and 41b having mutually different widths in the Y-direction.

The electrode portion 41a is a portion of the electrode layer 41 which is located between the connection portion 18c of one interconnect portion 18 and the connection portion 18c of the other interconnect portion 18 in the interconnect portions 18 disposed adjacent to each other in the Y-direction.

The electrode portion 41b is a portion of the electrode layer 41 which is located between the wide portion 18b of one interconnect portion 18 and the wide portion 18b of the other interconnect portion 18 in the interconnect portions 18 disposed adjacent to each other in the Y-direction. That is, the electrode portion 41b is located between the convex portions 18b1 provided in two interconnect portions 18.

A width W4 in the Y-direction of the electrode portion 41b is smaller than a width W3 in the Y-direction of the electrode portion 41a.

On the other hand, in the memory cell region Rmc, the electrode layer 41 includes an electrode portion 41c. For example, a width in the Y-direction of the electrode portion 41c corresponds to a net width of the electrode layer 41 obtained by subtracting a total value of a width Wc1 of the columnar portion CL disposed along the Y-direction from the width W3 of the electrode portion 41a. In the example shown in FIG. 2, the width in the Y-direction of the electrode portion 41c is a sum of the widths of a width W5 of the electrode layer 41 between the interconnect portion 18 and a columnar portion CL1, a width W6 of the electrode layer 41 between the interconnect portion 18 and a columnar portion CL2, and a width W7 of the electrode layer 41 between the columnar portions CL1 and CL2.

The width W4 in the Y-direction of the electrode portion 41b is desirably set to not smaller than the width in the Y-direction of the electrode portion 41c. In this case, as shown in FIG. 3, when a thickness in the Z-direction of the electrode layer 41 is represented by W8, a sectional area of a Y-Z cross section of the electrode portion 41b is represented by a product of the width W4 in the Y-direction of the electrode portion 41b by the thickness W8 in the Z-direction of the electrode layer 41. On the other hand, a sectional area of a Y-Z cross section of the electrode portion 41c is represented by a product of the width in the Y-direction of the electrode portion 41c by the thickness W8 in the Z-direction of the electrode layer 41. Then, the sectional area of the Y-Z cross section of the electrode portion 41b becomes not smaller than the sectional area of the Y-Z cross section of the electrode portion 41c.

By setting the widths of the electrode portions 41b and 41c in this manner, the width of the electrode layer 41 (the sectional area of the electrode layer 41) does not become smaller in the contact region Rc than in the memory cell region Rmc, and therefore, in the electrode layer 41 in which a current flows in the X-direction, an increase in a resistance value of the electrode portion 41b is suppressed. Therefore, this prevents a current from becoming difficult to flow in the electrode layer 41.

As shown in FIG. 3, FIG. 4A, and FIG. 4B, the interconnect portion 18 includes a conductive portion 18A, a conductive portion 18B, and a peripheral portion 18C.

As shown in FIG. 3, the conductive portion 18A is provided on a lower side of the plate-shaped portion 18a of the interconnect portion 18, and the conductive portion 18B is provided on an upper side of the plate-shaped portion 18a of the interconnect portion 18. The conductive portion 18B is provided on the conductive portion 18A.

As shown in FIG. 4A and FIG. 4B, the conductive portion 18A is provided on an outside of the wide portion 18b of the interconnect portion 18, and the conductive portion 18B is provided on an inside of the wide portion 18b of the interconnect portion 18. The conductive portion 18A is provided along a bottom surface 18s1 and an inner wall surface 18s2 of the convex portion 18b1. Further, in the convex portion 18b1, the conductive portion 18A covers the conductive portion 18B.

A sectional area of a Y-Z cross section of the conductive portion 18B in the wide portion 18b is larger than a sectional area of a Y-Z cross section of the conductive portion 18B in the plate-shaped portion 18a.

The conductive portion 18A contains, for example, silicon. The silicon is, for example, polysilicon obtained by crystallization of amorphous silicon. The conductive portion 18B contains, for example, tungsten.

As shown in FIG. 3, in the plate-shaped portion 18a of the interconnect portion 18, the peripheral portion 18C is provided on a bottom surface and on a side surface of the conductive portion 18A, and also on a side surface of the conductive portion 18B. The peripheral portion 18C covers the conductive portions 18A and 18B.

As shown in FIGS. 4A and 4B, in the wide portion 18b of the interconnect portion 18, the peripheral portion 18C is provided on a bottom surface and on a side surface of the conductive portion 18A. The peripheral portion 18C covers the conductive portion 18A.

The peripheral portion 18C includes, for example, layers 18C1 and 18C2. A surface of the layer 18C1 is covered with the layer 18C2. The layer 18C1 contains, for example, titanium nitride (TiN). The layer 18C2 contains, for example, titanium (Ti). For example, by the layers 18C1 and 18C2, a barrier metal layer is formed.

Around the interconnect portion 18, a side wall 19 having an insulating property is provided. The side wall 19 includes insulating films 19a and 19b. The insulating film 19a is provided around the interconnect portion 18, and the insulating film 19b is provided around the insulating film 19a. The insulating films 19a and 19b contain, for example, silicon oxide. By the side wall 19, the interconnect portion 18 is electrically insulated from the electrode layer 41 of the stacked body 15.

A lower end of the interconnect portion 18 is in contact with the substrate 10. For example, a lower end of the interconnect portion 18 is in contact with a connection member 10c formed in the substrate 10. The connection member 10c is a member formed in the substrate 10, and is formed by, for example, doping an impurity such as boron (B) into the substrate 10.

As shown in FIG. 2, on an upper end of the interconnect portion 18, a plurality of contact portions Cs is provided. The plurality of contact portions Cs is located in the contact region Rc. The number or arrangement of the contact portions Cs is arbitrary. In the example shown in FIG. 2, the contact portions Cs are located on the wide portion 18b and on the connection portion 18c of the contact region Rc. The contact portions Cs may be located only on the wide portion 18b.

In the memory cell region Rmc, at a crossing portion between the channel 20 and the word line WL, a memory cell MC including a charge storage film 22 is formed, and a plurality of memory cells MC is arranged in a three-dimensional matrix along the X-direction, Y-direction, and Z-direction. In the memory cell region Rmc, a predetermined potential is applied to the electrode layer 41 and the bit line BL, and in the contact region Rc, a predetermined potential is applied to the source line SL. By doing this, data can be stored in each memory cell MC.

Hereinafter, a method for manufacturing the semiconductor memory device 1 according to the first embodiment will be described.

First, with reference to FIG. 5A and FIG. 5B, and FIG. 6A and FIG. 6B, a process for manufacturing a columnar portion CL will be described.

Figure 5A:
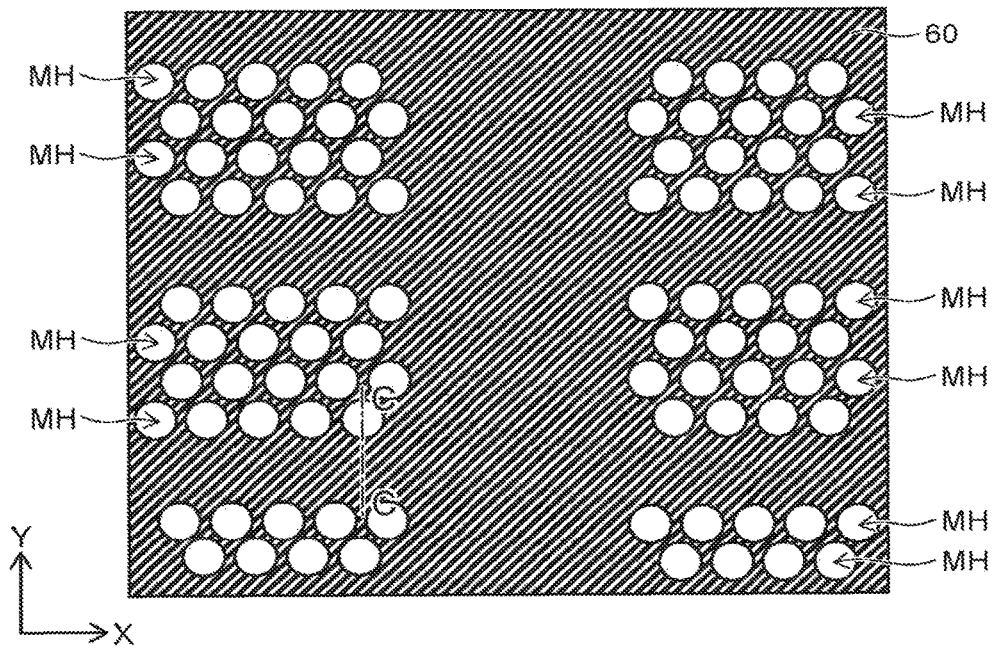
Figure 5B:
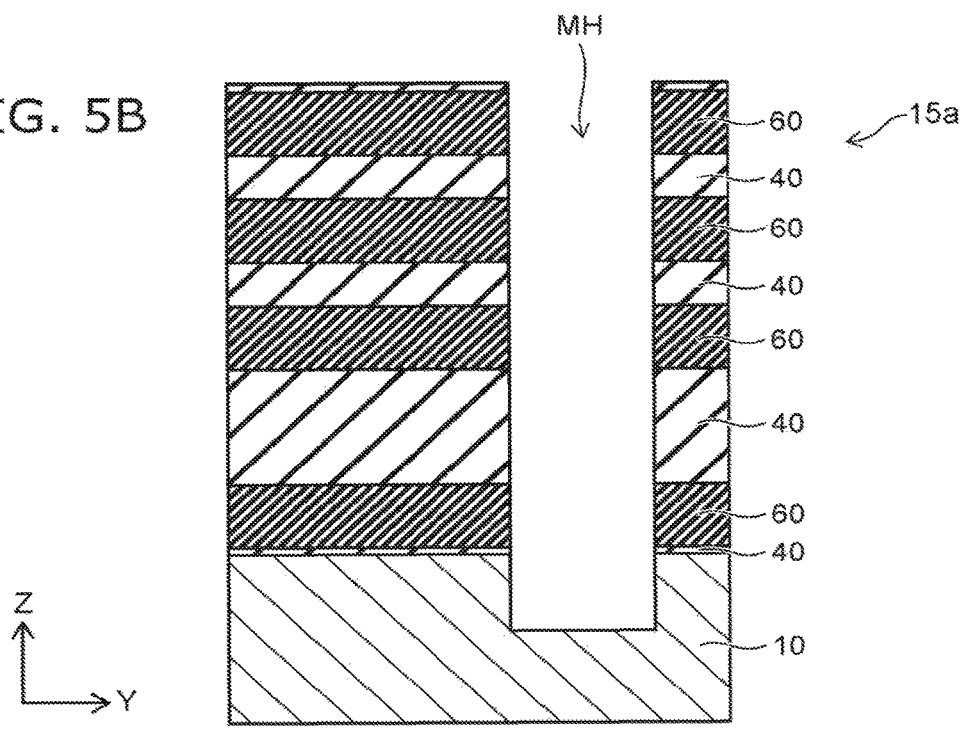
Figure 6A:
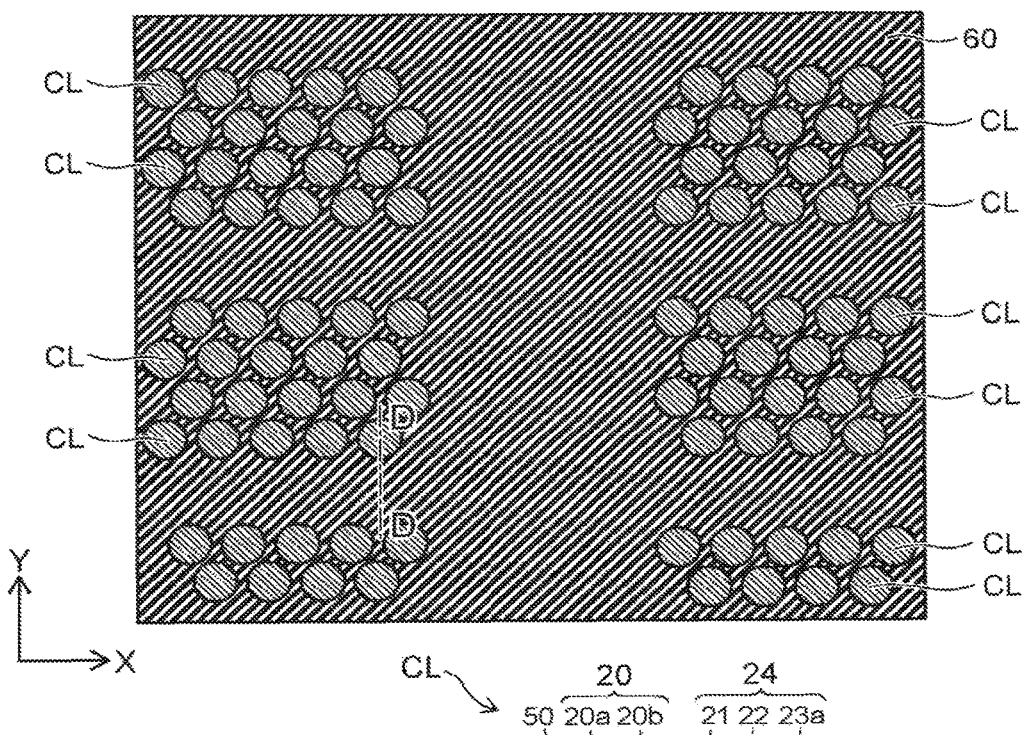
Figure 6B:
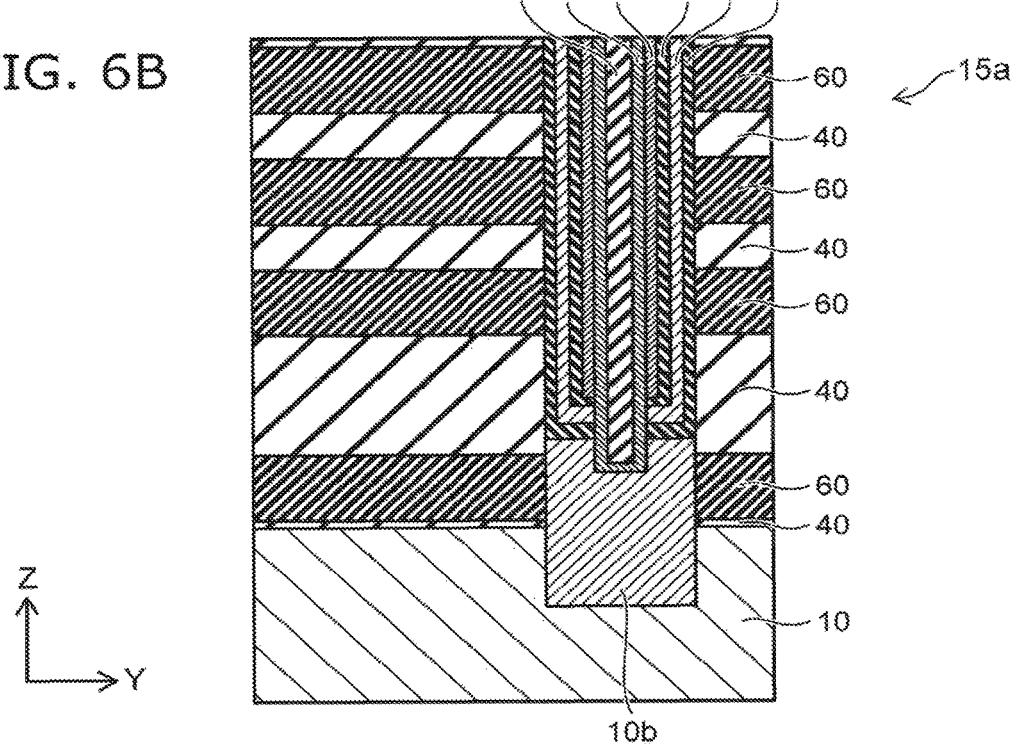

FIG. 5A and FIG. 6A are each a view showing a process for manufacturing the region shown in FIG. 2. FIG. 5B and FIG. 6B show cross sections taken along a line C-C of FIG. 5A and a line D-D of FIG. 6A, respectively, and are each a view showing a process for manufacturing the region shown in FIG. 3.

As shown in FIG. 5A and FIG. 5B, an insulating layer 40 and a sacrifice layer 60 are alternately stacked along the Z-direction on a substrate 10 by, for example, a CVD (Chemical Vapor Deposition) method, whereby a stacked body 15a is formed. The insulating layer 40 is formed of, for example, silicon oxide. The sacrifice layer 60 is formed of a material having an etching selection ratio with respect to the insulating layer 40, and is formed of, for example, silicon nitride.

Subsequently, a plurality of memory holes MH is formed in the stacked body 15a by, for example, RIE (Reactive Ion Etching). The memory holes MH extend in the Z-direction and pierce the stacked body 15a to reach the substrate 10. For example, a part of the substrate 10 is removed, and a bottom surface of the memory hole MH is located on a lower side of the stacked body 15a. As shown in FIG. 5A, a shape of the memory hole MH is, for example, a circle when it is viewed from the Z-direction.

As shown in FIG. 6A and FIG. 6B, after forming the memory holes MH, for example, a connection member 10b is formed over an inner portion of the stacked body 15a from an inner portion of the substrate 10 by epitaxially growing silicon.

Subsequently, by, for example, a CVD method, an insulating film 23a is formed by depositing silicon oxide on an inner surface of the memory hole MH, a charge storage film 22 is formed by depositing silicon nitride, and a tunnel insulating film 21 is formed by depositing silicon oxide. Subsequently, a cover layer 20b is formed by depositing silicon. Thereafter, by performing RIE, the cover layer 20b, the tunnel insulating film 21, the charge storage film 22, and the insulating film 23a are removed, whereby the substrate 10 (connection member 10b) is exposed. By doing this, a memory film 24 is formed.

Subsequently, a body 20a is formed by depositing silicon in the memory hole MH. By doing this, a channel 20 including the body 20a and the cover layer 20b is formed. Subsequently, a core portion 50 is formed by depositing silicon oxide. By doing this, a columnar portion CL including the core portion 50, the channel 20, and the memory film 24 is formed. The body 20a of the channel 20 is in contact with the connection member 10b formed in the substrate 10.

Next, with reference to FIG. 7, FIG. 8A and FIG. 8B to FIG. 11A and FIG. 11B, a process for manufacturing an interconnect portion 18 will be described.

Figure 7:
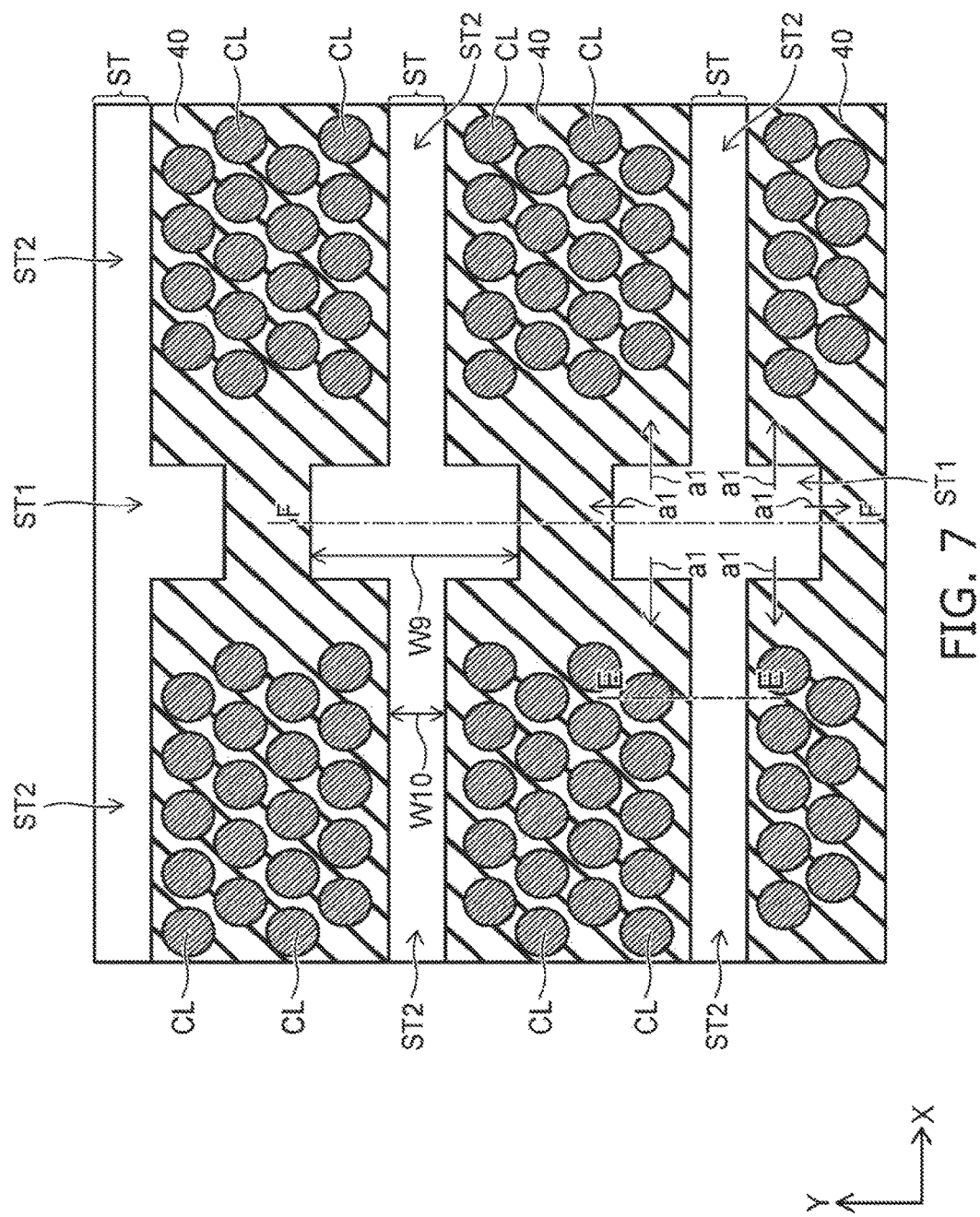

FIG. 7 shows a plane in which the insulating layer 40 of the stacked body 15a is extracted. FIG. 8A and FIG. 8B to FIG. 11A and FIG. 11B are each a view showing a process for manufacturing lower layers of the stacked bodies 15a and 15.

Figure 8A:
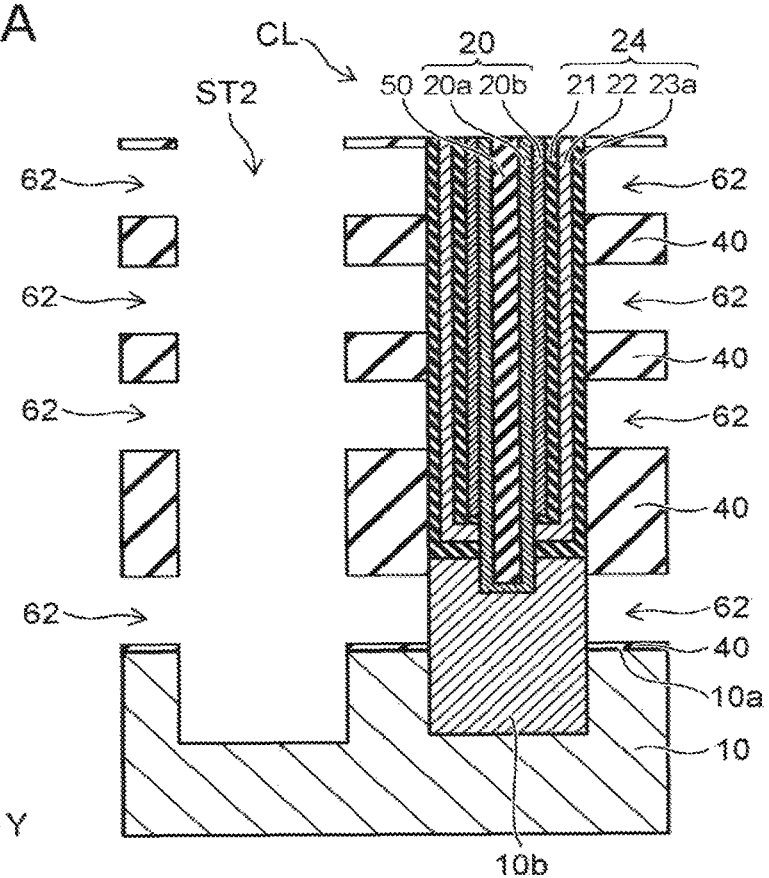
Figure 8B:
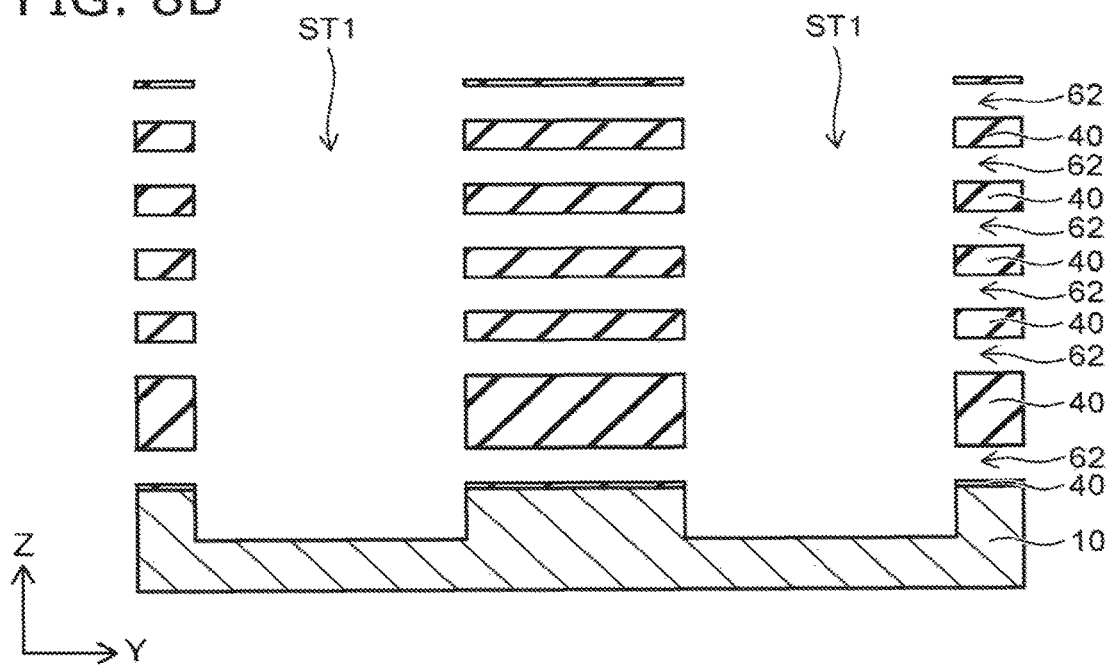

Incidentally, FIG. 8A and FIG. 8B show cross sections taken along a line E-E and a line F-F of FIG. 7, respectively. FIG. 9A to FIG. 11A each show continuation of the process for manufacturing the region shown in FIG. 8A, and FIG. 9B to FIG. 11B each show continuation of the process for manufacturing the region shown in FIG. 8B.

As shown in FIG. 7, FIG. 8A, and FIG. 8B, a plurality of slits ST extending in the X-direction is formed in the stacked body 15a by, for example, a photolithography method and RIE. The slits ST are made to pierce the stacked body 15a. By doing this, the stacked body 15a is divided into a plurality of stacked bodies extending in the X-direction by the slits ST. Each region separated by the slits ST is called "block". The columnar portion CL selected one by one from each block is electrically connected to one bit line BL (see FIG. 1).

Further, in the slit ST, in a region (contact region Rc) in which the columnar portion CL is not disposed, a wide portion ST1 having a width which expands in the Y-direction as compared with the other portions is formed. For example, the wide portion ST1 is formed by a photolithography method and etching using a mask having a width which is partially different in the Y-direction. A width W9 of the wide portion ST1 is larger than a width W10 of a plate-shaped portion ST2 of the slit ST. Since the wide portion ST1 is formed in the slit ST as shown in FIG. 7, portions having mutually different widths in the Y-direction are formed in the insulating layer 40. Such a portion is formed also in the sacrifice layer 60.

Subsequently, by performing wet etching through the slit ST, the sacrifice layer 60 is removed. In a case where the sacrifice layer 60 is formed of silicon nitride, an etching treatment is performed using phosphoric acid as an etchant. By removing the sacrifice layer 60 through the slit ST, a cavity 62 is formed.

Figure 9A:
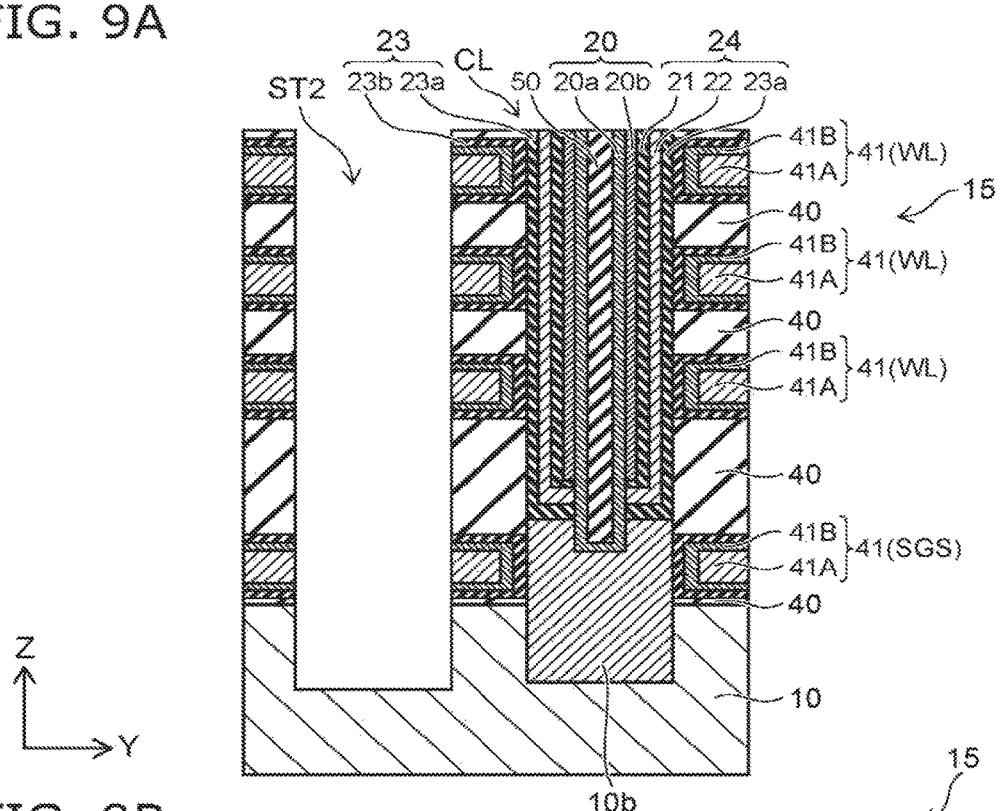
Figure 9B:
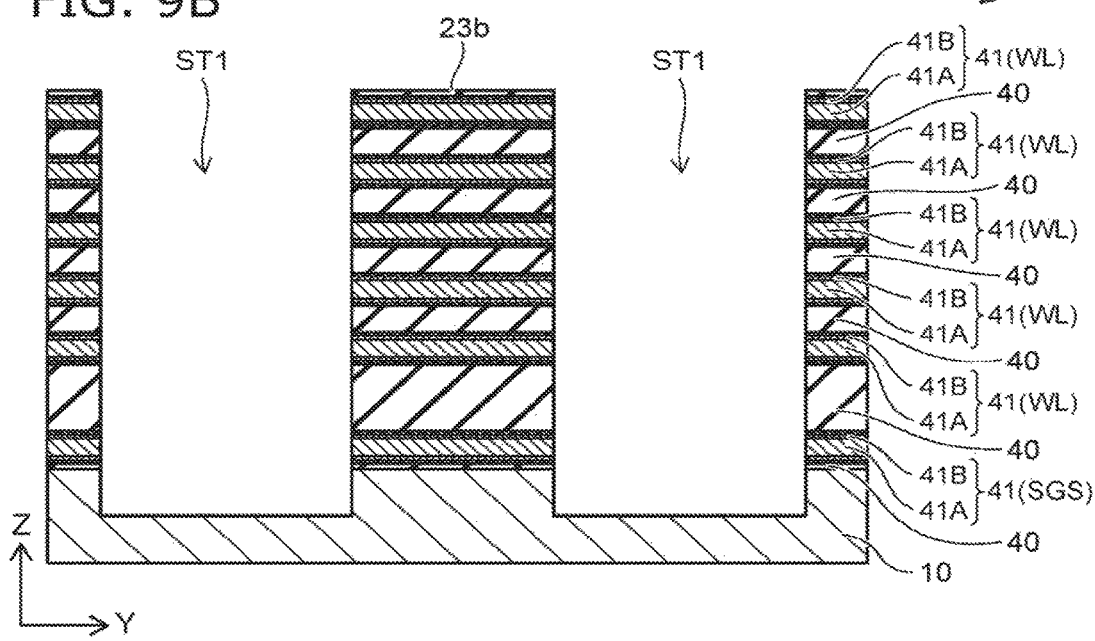

Since the wide portion ST1 is formed in the slit ST, as indicated by an arrow a1 in FIG. 7, the etchant penetrates into the stacked body 15a through the wide portion ST1 from the ±X-direction and the ±Y-direction. On the other hand, in a case where the wide portion ST1 is not formed, that is, in a case where the slit ST is formed only of the plate-shaped portion ST2, the etchant penetrates into the stacked body 15a through the slit ST (plate-shaped portion ST2) from the ±Y-direction. Therefore, in a case where the wide portion ST1 is formed in the slit ST, the etchant easily penetrates into the stacked body 15a, and therefore, the sacrifice layer 60 is easily removed. According to this, the sacrifice layer 60 is prevented from remaining in the stacked body 15a without being removed. As shown in FIG. 9A and FIG. 9B, an insulating film 23b is formed by depositing aluminum oxide on an inner surface of the cavity 62 by, for example, a CVD method. By doing this, a block insulating film 23 including the insulating films 23a and 23b is formed. Thereafter, by, for example, a CVD method, a peripheral portion 41B is formed by depositing titanium nitride on the insulating film 23b, and a main body portion 41A is formed by depositing a metal material such as tungsten on the peripheral portion 41B. By doing this, an electrode layer 41 including the main body portion 41A and the peripheral portion 41B is formed. Further, a stacked body 15 in which the insulating layer 40 and the electrode layer 41 are alternately stacked is formed.

Since the wide portion ST1 is formed in the slit ST, a metal material is more easily deposited in the cavity 62 as compared with a case where the wide portion ST1 is not formed, that is, in a case where the slit ST is formed only of the plate-shaped portion ST2. According to this, generation of a gap without depositing a metal material in the cavity 62 can be suppressed.

Figure 10A:
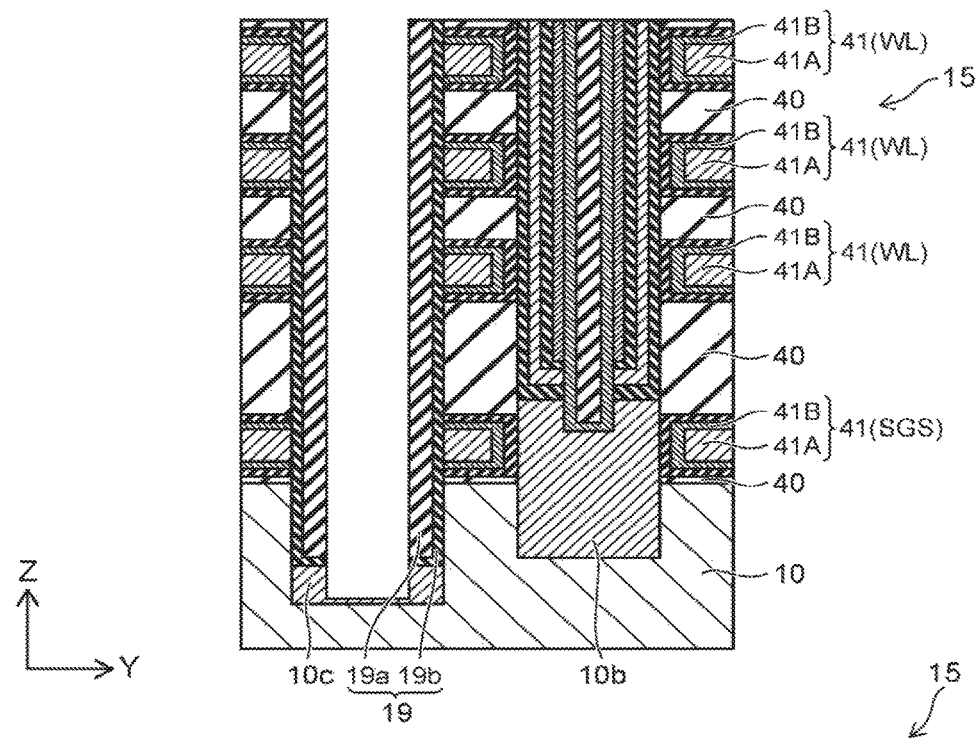
Figure 10B:
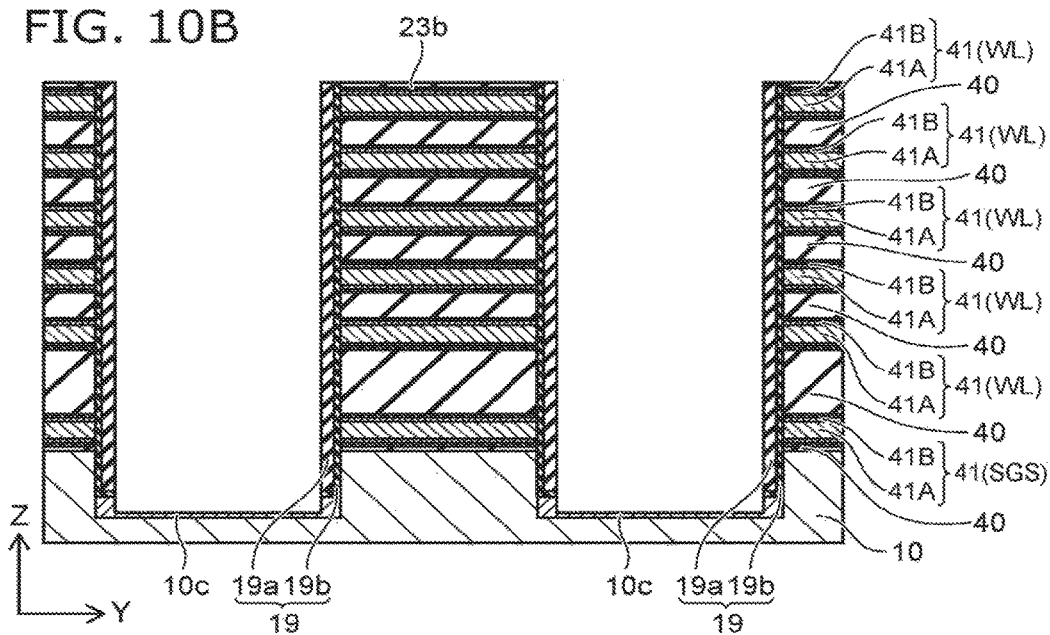

As shown in FIG. 10A and FIG. 10B, an impurity such as boron is doped into a surface, which is a bottom surface of the slit ST, and on which the substrate 10 is exposed. By doing this, a connection member 10c is formed. The impurity is doped by, for example, ion implantation.

Subsequently, silicon oxide is deposited by, for example, a CVD method, and thereafter, a silicon oxide film is removed by performing RIE, whereby the substrate 10 (connection member 10c) is exposed. By doing this, a side wall 19 including insulating films 19a and 19b is formed.

Figure 11A:
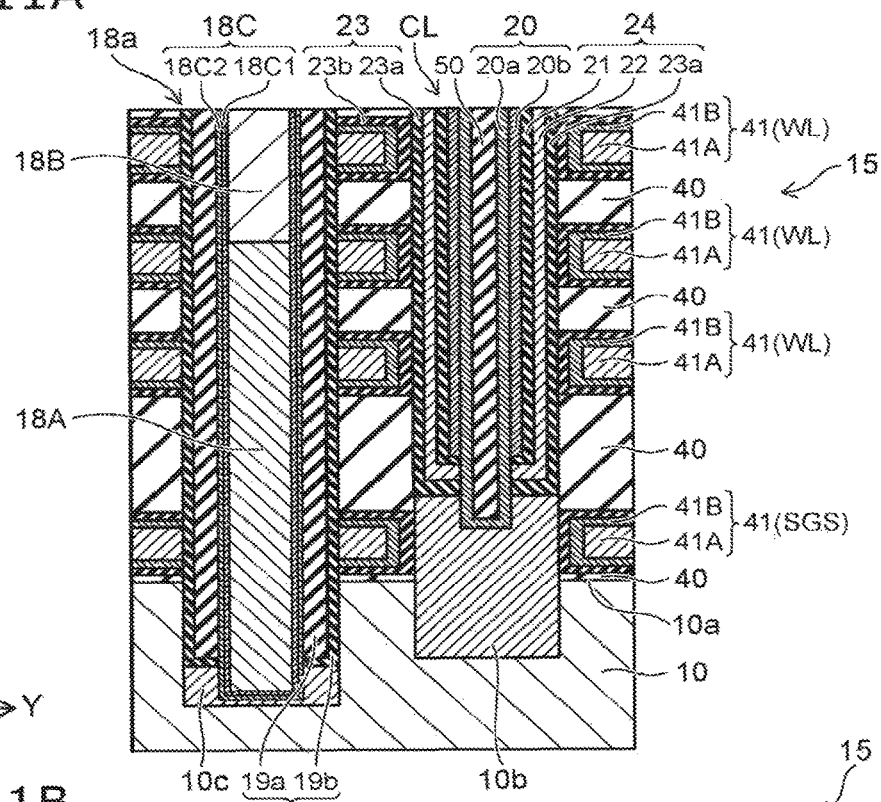
Figure 11B:
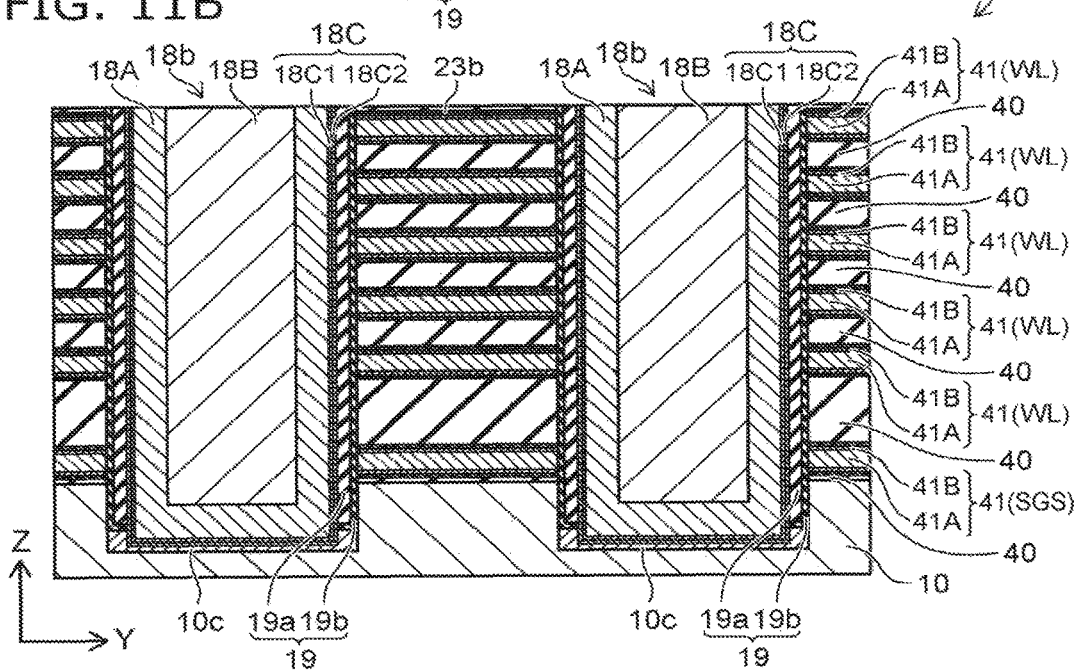

As shown in FIG. 11A and FIG. 11B, a layer 18C2 is formed by depositing a metal material such as titanium on the side wall 19, and thereafter, a layer 18C1 is formed by depositing titanium nitride on the layer 18C2. By doing this, a peripheral portion 18C including the layers 18C1 and 18C2 is formed.

Subsequently, by, for example, a CVD method, a conductive portion 18A is formed by depositing silicon on the peripheral portion 18C, and thereafter a conductive portion 18B is formed by depositing a metal material such as tungsten. By doing this, an interconnect portion 18 including the conductive portions 18A and 18B is formed.

As shown in FIG. 7, in the slit ST, the width W9 of the wide portion ST1 is larger than the width W10 of the plate-shaped portion ST2. According to this, the conductive portion 18A is formed in a lower part of the plate-shaped portion ST2 so as to block up the plate-shaped portion ST2 as shown in FIG. 11A, and is formed along a bottom surface and an inner surface of the wide portion ST1 as shown in FIG. 11B. Thereafter, the conductive portion 18B is formed in an upper part of the plate-shaped portion ST2 so as to block up the plate-shaped portion ST2 as shown in FIG. 11A, and is formed so as to block up the wide portion ST1 as shown in FIG. 11B.

Therefore, in the wide portion ST1 and the plate-shaped portion ST2, the conductive portions 18A and 18B are formed in different forms. Incidentally, the interconnect portion 18 formed in the wide portion ST1 corresponds to the wide portion 18b, and the interconnect portion 18 formed in the plate-shaped portion ST2 corresponds to the plate-shaped portion 18a and the connection portion 18c.

Next, with reference to FIG. 12A and FIG. 12B to FIG. 15A and FIG. 15B, a process for manufacturing contact portions Cb, Cs, and V1, a lower layer source line SL1, and an upper layer source line SL2 will be described.

Figure 14A:
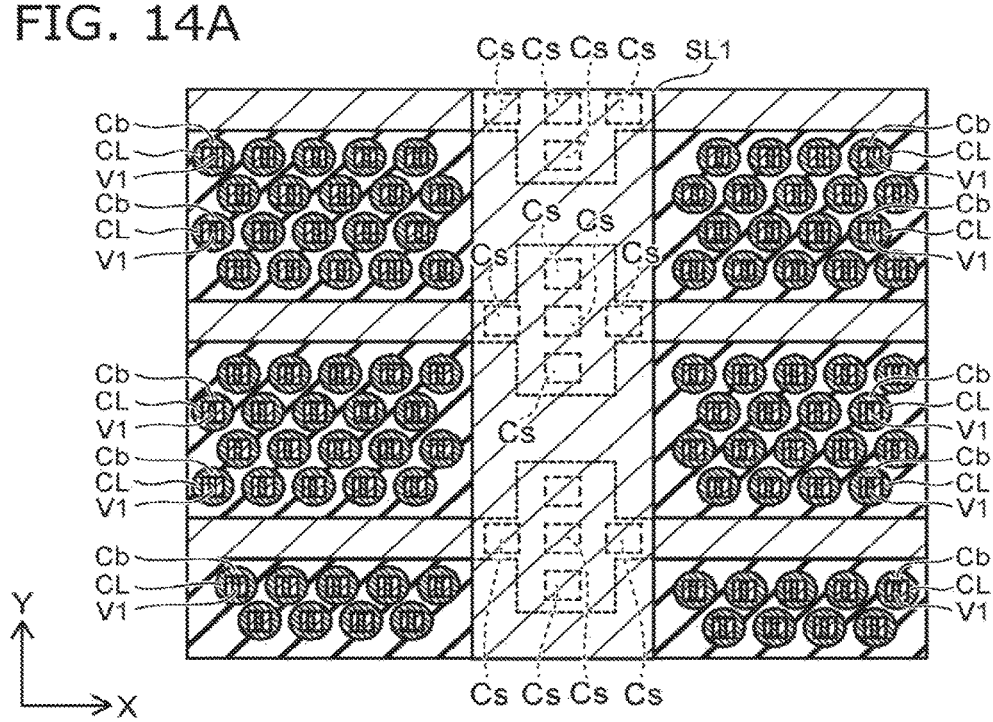
Figure 14B:
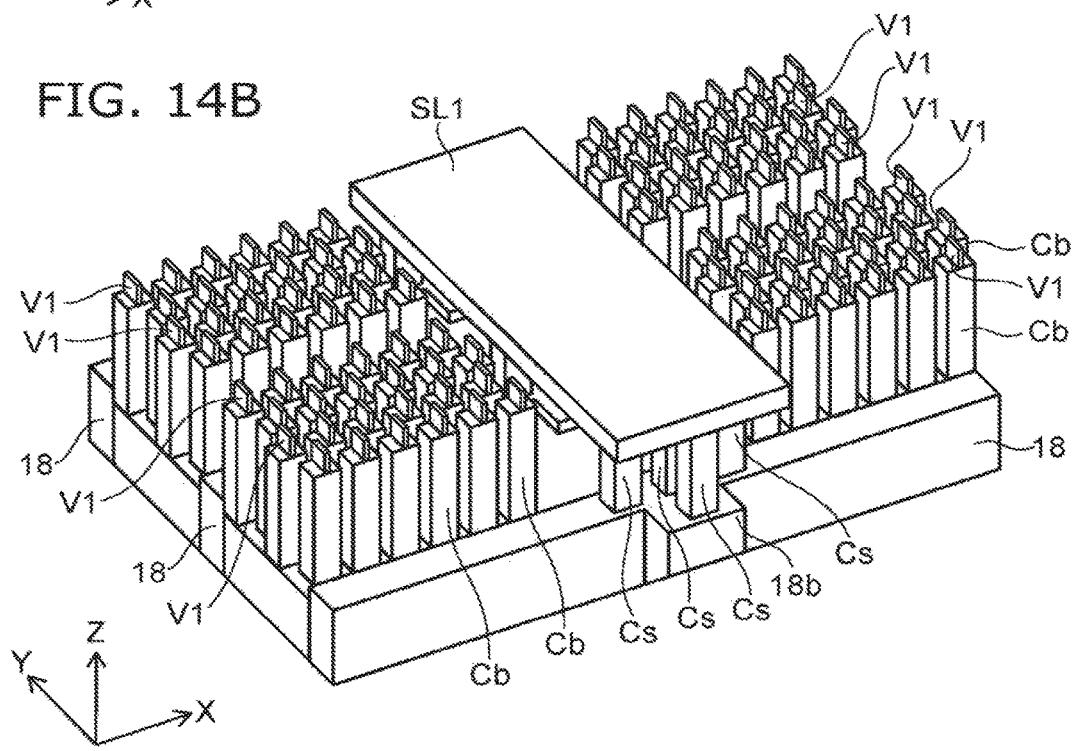
Figure 15A:
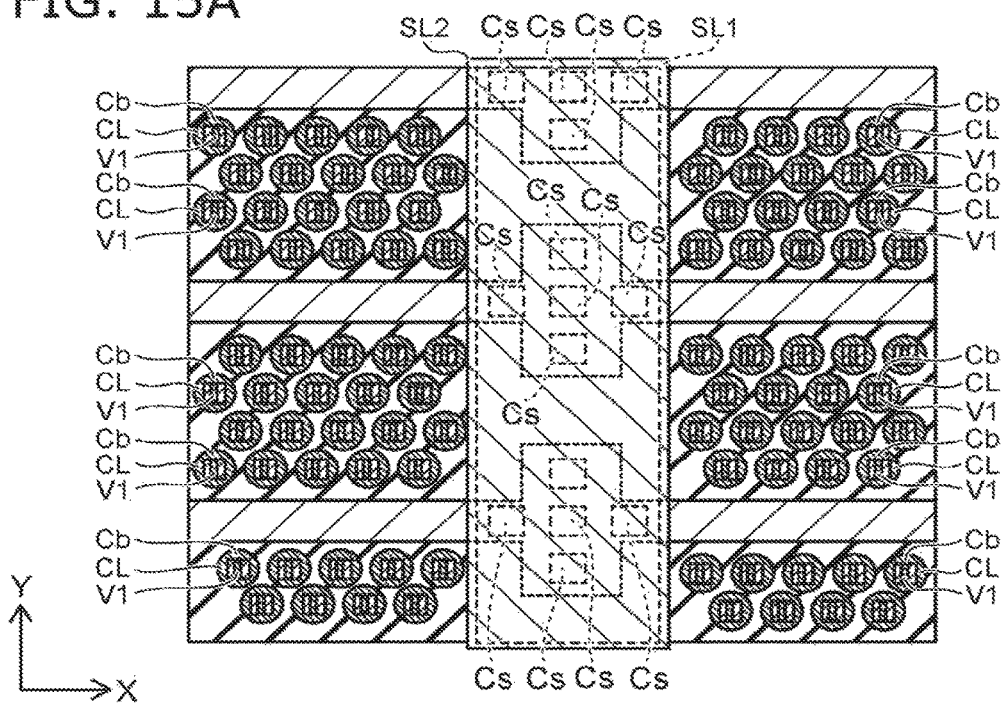

FIG. 12A to FIG. 15A are each a view showing a process for manufacturing the region shown in FIG. 2. FIG. 12B to FIG. 15B show the regions shown in FIG. 12A to FIG. 15A in perspective, respectively. Incidentally, in FIG. 15A and FIG. 15B, illustration of the bit line BL is omitted.

Figure 12A:
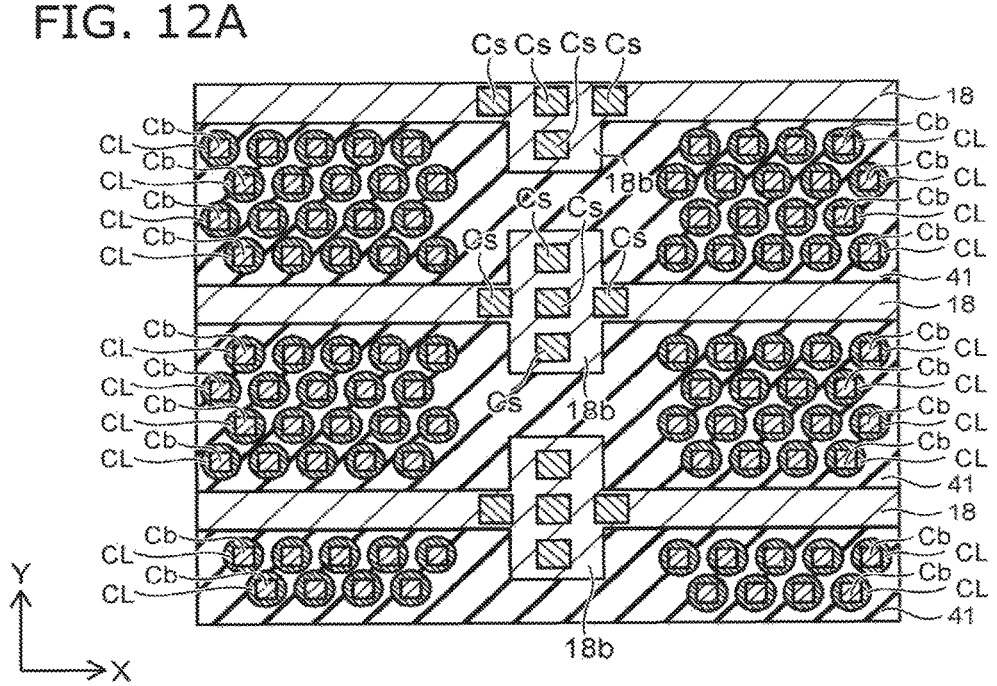
Figure 12B:
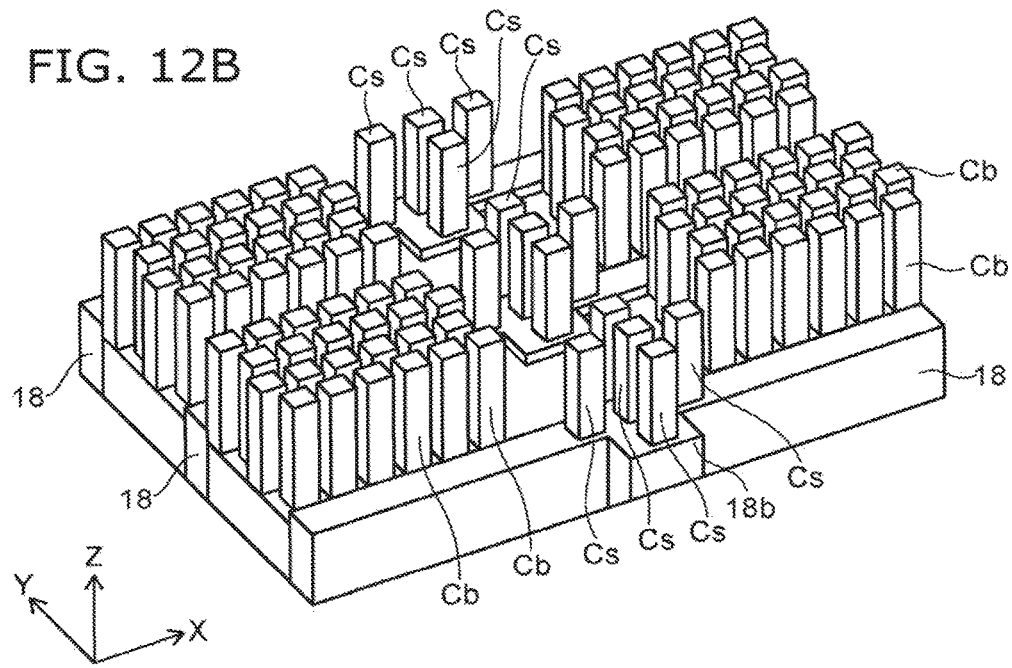

As shown in FIG. 12A and FIG. 12B, after an insulating layer (not shown) is formed on the columnar portion CL and the interconnect portion 18, a contact hole piercing the insulating layer is formed immediately above the columnar portion CL and the interconnect portion 18. Thereafter, a metal material such as tungsten is buried in the contact hole, whereby contact portions Cb and Cs are formed. A lower end of the contact portion Cb is connected to the columnar portion CL, and a lower end of the contact portion Cs is connected to the interconnect portion 18. For example, on the wide portion 18b of the interconnect portion 18, the contact portion Cs is formed. Since the wide portion 18b having a width which expands in the Y-direction is formed, the degree of freedom of the formation position of the contact portion Cs is high.

Figure 13A:
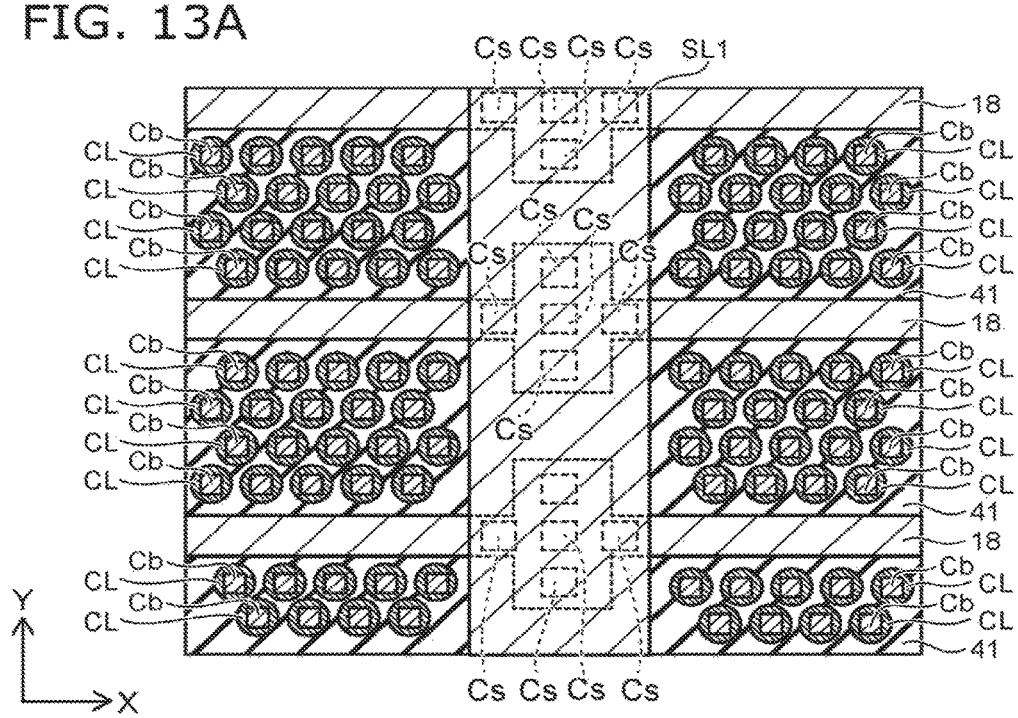
Figure 13B:
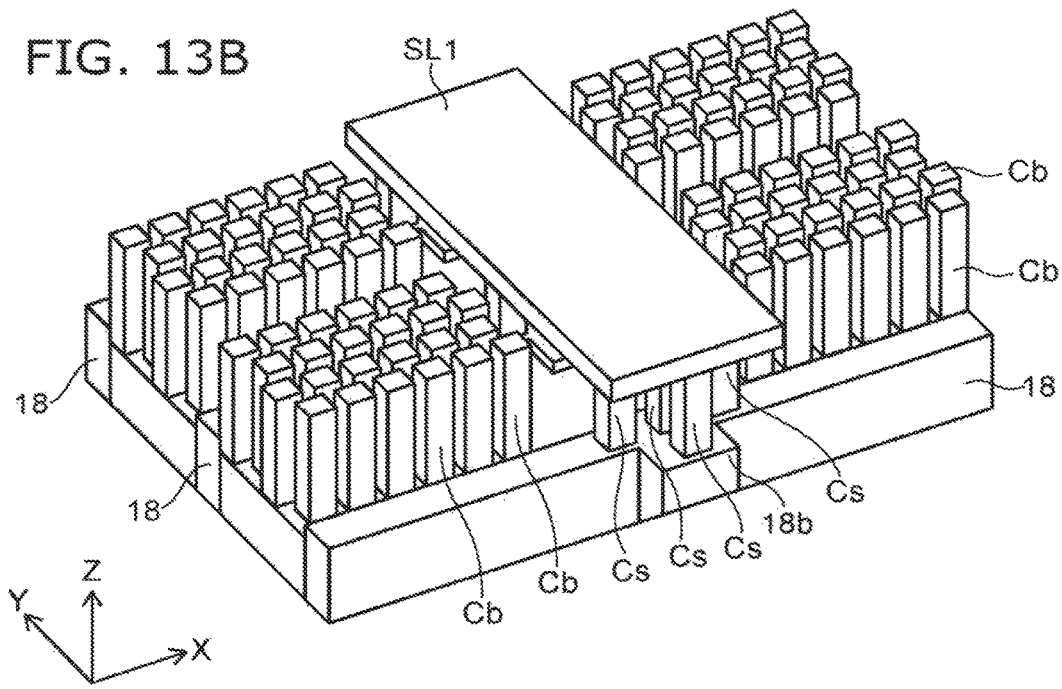

As shown in FIG. 13A and FIG. 13B, on the contact portion Cs, a lower layer source line SL1 is formed of a conductor such as a metal. The lower layer source line SL1 extends in the Y-direction so as to cover the wide portion 18b of the interconnect portion 18, and a lower end thereof is connected to an upper end of the contact portion Cs. On a lower side of the lower layer source line SL1, the columnar portion CL and the contact portion Cb are not located.

As shown in FIG. 14A and FIG. 14B, after an insulating layer (not shown) is formed on the contact portion Cb, a contact hole piercing the insulating layer is formed immediately above the contact portion Cb, and then, a metal material such as tungsten is buried in the contact hole, whereby a contact portion V1 is formed. A lower end of the contact portion V1 is connected to an upper end of the contact portion Cb. Incidentally, the contact portion V1 is located on an upper side of the lower layer source line SL1.

Figure 15B:
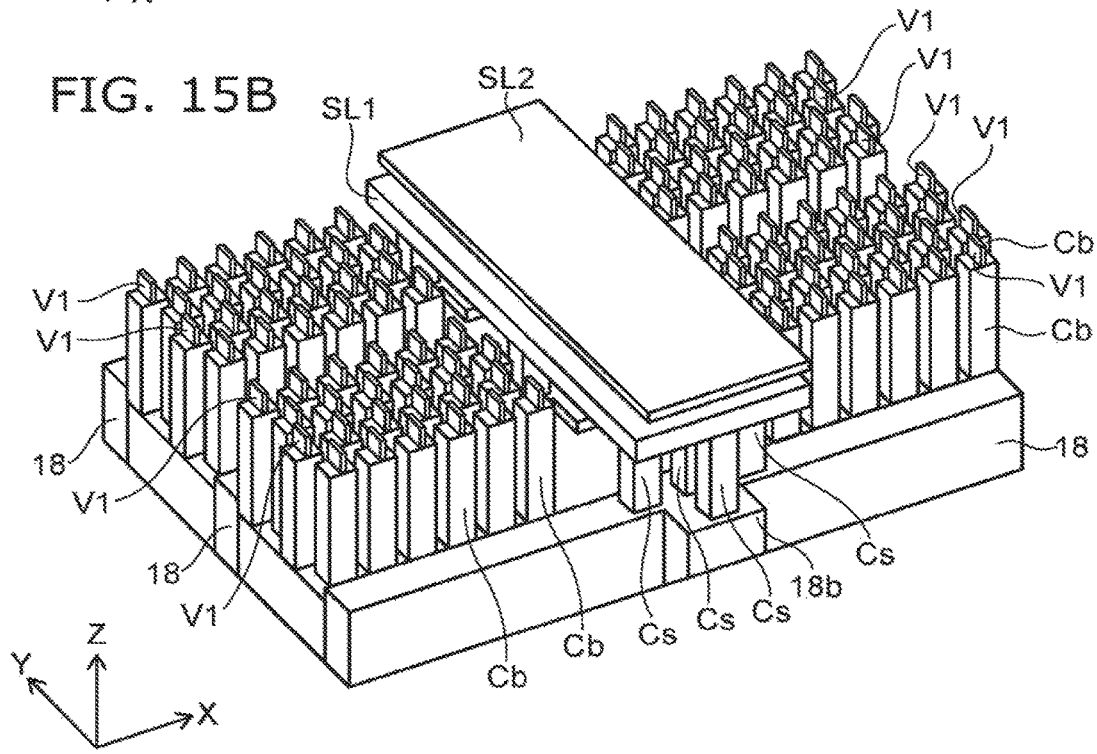

As shown in FIG. 15A and FIG. 15B, after a contact (not shown) is formed on the lower layer source line SL1, an upper layer source line SL2 is formed of a conductor such as a metal on the contact. The upper layer source line SL2 extends in the Y-direction, and a lower end thereof is connected to an upper end of the lower layer source line SL1 through the contact. On a lower side of the upper layer source line SL2, the columnar portion CL and the contact portion Cb are not located.

Thereafter, a bit line BL (see FIG. 1) which is connected to the contact portion V1 is formed.

In this manner, the semiconductor memory device 1 according to the first embodiment is formed.

In the semiconductor memory device 1 according to the embodiment, the interconnect portion 18 extends in the Z-direction and X-direction, and includes the wide portion 18b having a width which expands in the Y-direction in the contact region Rc in which the columnar portion CL is not provided. A volume of the interconnect portion 18 increases in the wide portion 18b, and therefore, a resistance of the interconnect portion 18 can be decreased as compared with a case where the interconnect portion 18 does not include the wide portion 18b, for example, in a case where the interconnect portion 18 is formed only of the plate-shaped portion 18a. According to this, a current easily flows in the source line SL including the interconnect portion 18.

Further, in a case where a part of the interconnect portion 18 is formed of a non-metallic material for reducing warpage of the substrate 10, a volume of a conductive portion containing tungsten or the like can be increased in the wide portion 18b. That is, the conductive portion 18A of a non-metallic material is formed on a lower side of the plate-shaped portion 18a and on an outer side of the wide portion 18b, and the conductive portion 18B of a metal material is formed on an upper side of the plate-shaped portion 18a and on an inner side of the wide portion 18b. Therefore, the form of the formation of the conductive portion 18B is different between the plate-shaped portion 18a and the wide portion 18b, and a volume of the conductive portion 18B in the wide portion 18b is increased, and therefore, a resistance of the interconnect portion 18 can be decreased.

The wide portion 18b is provided partially in the interconnect portion 18 by being located in the contact region Rc. Therefore, even if the volume of the conductive portion 18B of a metal material is increased in the wide portion 18b, an effect on the warpage of the substrate 10 can be reduced. Further, in a case where a plurality of semiconductor memory devices 1 is formed by forming a structure body on a wafer including the substrate 10, followed by dicing the wafer and the structure body, the warpage of the substrate 10 appears as the warpage of the wafer before dicing, and therefore, also an effect on the warpage of the wafer can be reduced.

Further, when the wide portion 18b is provided in the interconnect portion 18, the resistance of the interconnect portion 18 is decreased as compared with a case where the interconnect portion 18 does not include the wide portion 18b, and therefore, even if a width Wr in the X-direction of the contact region Rc (see FIG. 2) is decreased, an effect on electrical characteristics of the interconnect portion 18 is small. According to this, a size of the semiconductor memory device 1 can be decreased. When the width Wr in the X-direction of the contact region Rc is decreased, for example, an effect on operational characteristics of the memory cell MC can be reduced as compared with a case where the width Wr is expanded for decreasing the resistance of the interconnect portion 18.

Hereinafter, a variation of the first embodiment will be described.

Figure 16:
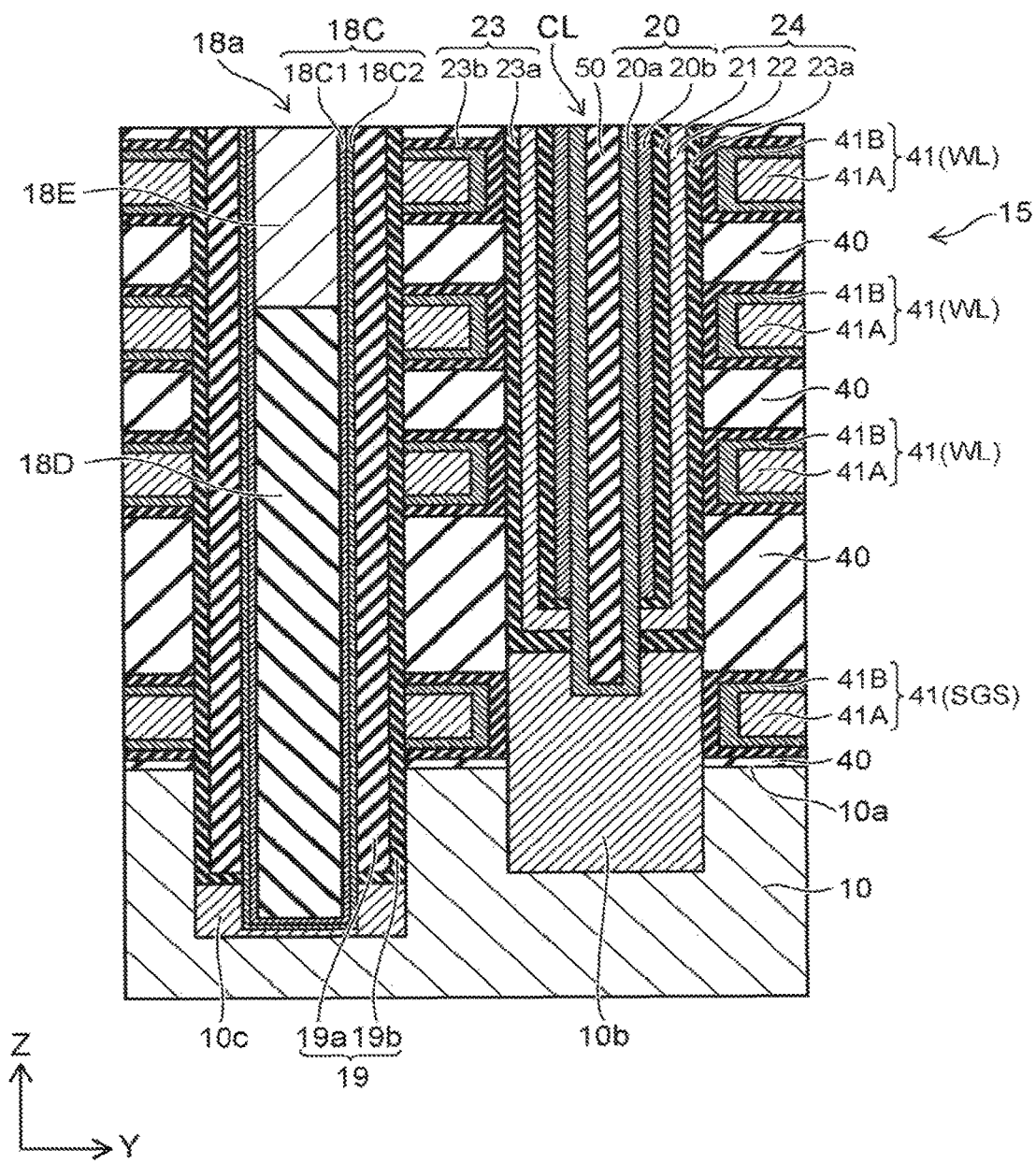
FIG. 16 and FIG. 17 are each a sectional view showing a semiconductor memory device according to a variation of the first embodiment.
Figure 17:
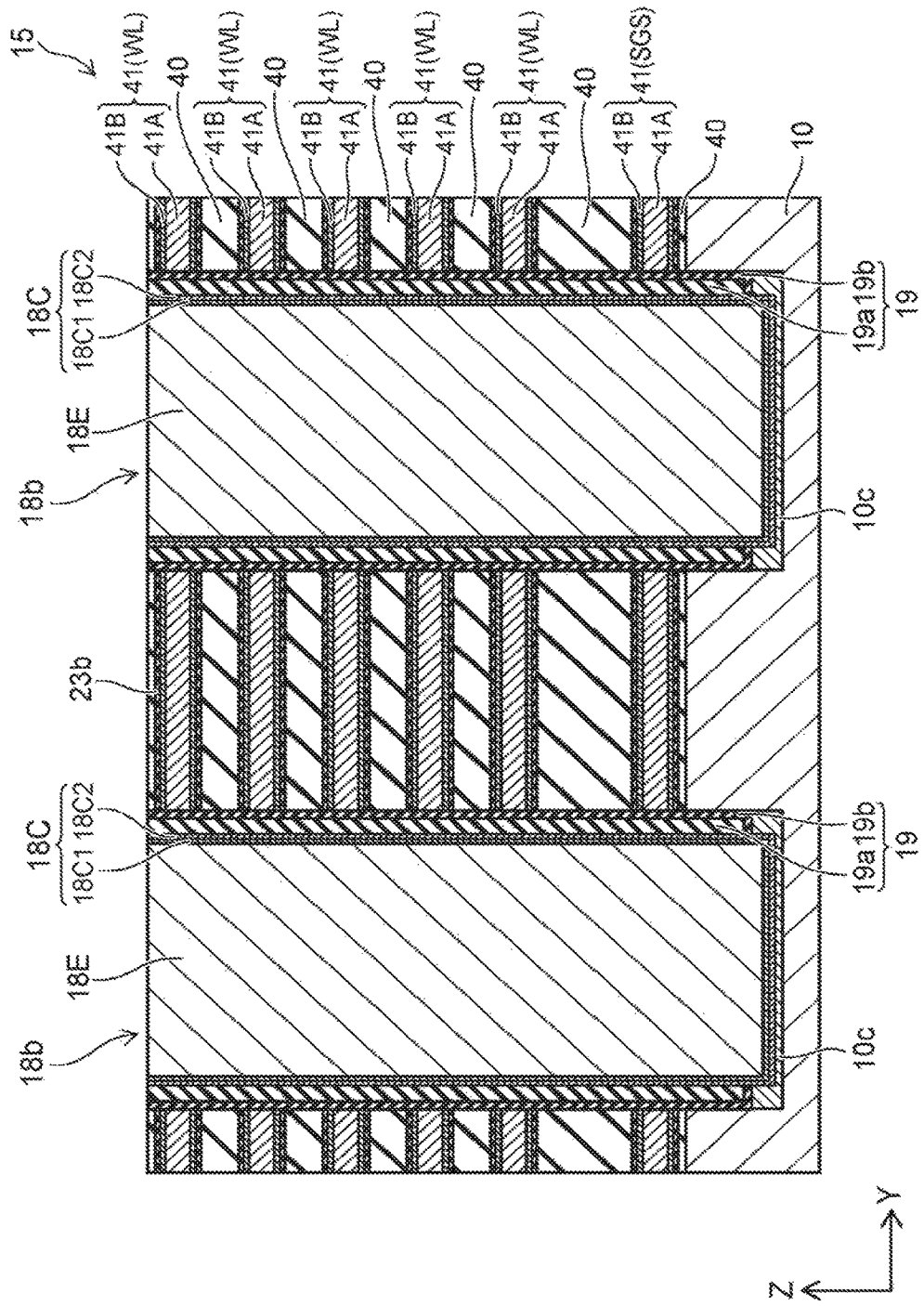

FIG. 16 and FIG. 17 are each a sectional view showing a semiconductor memory device according to a variation of the first embodiment.

FIG. 16 and FIG. 17 are views showing the regions shown in FIG. 3 and FIG. 4A, respectively.

As shown in FIG. 16 and FIG. 17, in a semiconductor memory device 2 according to the variation, an interconnect portion 18 includes an insulating portion 18D, a conductive portion 18E, and a peripheral portion 18C unlike the configuration of the interconnect portion 18 (see FIG. 3, FIG. 4A, and FIG. 4B) described above. The insulating portion 18D contains, for example, silicon oxide. The conductive portion 18E contains, for example, tungsten. The peripheral portion 18C includes, for example, layers 18C1 and 18C2. The layers 18C1 and 18C2 are conductive layers, and contain, for example, titanium nitride and titanium, respectively.

As shown in FIG. 16, the insulating portion 18D is provided on a lower side of a plate-shaped portion 18a of the interconnect portion 18, and the conductive portion 18E is provided on an upper side of the plate-shaped portion 18a of the interconnect portion 18. The conductive portion 18E is provided on the insulating portion 18D. The peripheral portion 18C is provided on a bottom surface and on a side surface of the insulating portion 18D and on a side surface of the conductive portion 18E.

As shown in FIG. 17, in a wide portion 18b of the interconnect portion 18, the conductive portion 18E is provided, and the insulating portion 18D is not provided. The peripheral portion 18C is provided on a bottom surface and a side surface of the conductive portion 18E.

In the variation, in the wide portion 18b of the interconnect portion 18, the conductive portion 18E containing tungsten or the like is electrically connected to the substrate 10 through the peripheral portion 18C. The bottom surface of the conductive portion 18E expands as compared with the configuration of the interconnect portion 18 as shown in FIG. 3, FIG. 4A, and FIG. 4B, and therefore, a contact resistance to the substrate 10 of the interconnect portion 18 can be decreased.

For example, in the configuration of the interconnect portion 18 shown in FIG. 3, FIG. 4A, and FIG. 4B, a contact resistance to the substrate 10 of the interconnect portion 18 becomes substantially equal to a resistance of the layer 18C1 of the peripheral portion 18C. On the other hand, in the configuration of the interconnect portion 18 of the variation, a contact resistance to the substrate 10 of the interconnect portion 18 is determined by a resistance of the layer 18C1 of the peripheral portion 18C and a resistance of the conductive portion 18E of the wide portion 18b, and becomes smaller than the resistance of the layer 18C1 of the peripheral portion 18C. Therefore, the contact resistance to the substrate 10 of the interconnect portion 18 is decreased.

Incidentally, the other effect of the variation is the same as that of the above-mentioned first embodiment.

Second Embodiment

Figure 18:
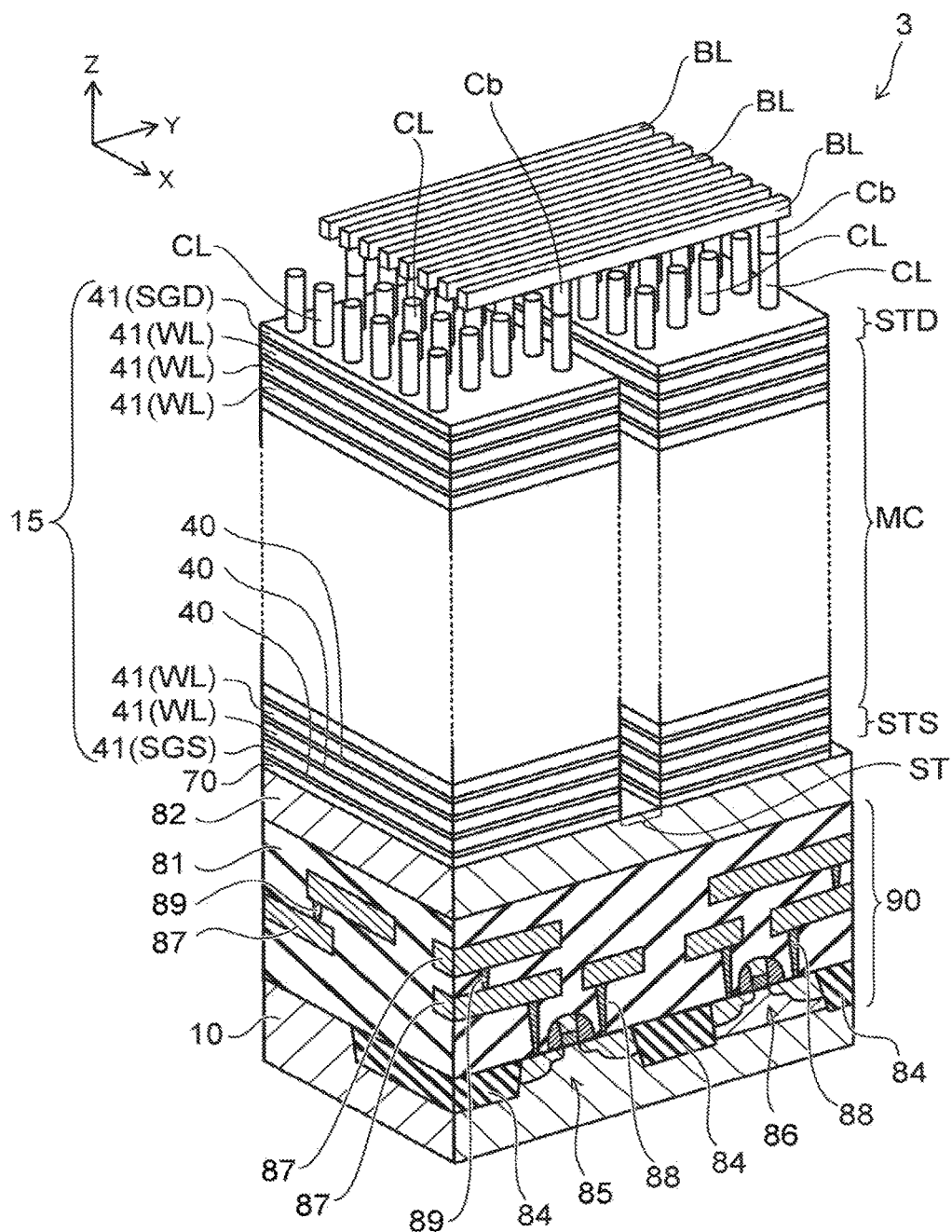
FIG. 18 is a perspective view showing a semiconductor memory device according to a second embodiment.

FIG. 18 is a perspective view showing a semiconductor memory device according to a second embodiment.

As shown in FIG. 18, in a semiconductor memory device 3 according to the embodiment, a subcell circuit 90 is provided between a substrate 10 and a stacked body 15 unlike the configuration of the semiconductor memory device 1 (see FIG. 1) according to the first embodiment described above.

In the semiconductor memory device 3, an interlayer insulating film 81, a source electrode film 82, and an insulating layer 70 are provided between the substrate 10 and the stacked body 15. The interlayer insulating film 81 and the insulating layer 70 contain, for example, silicon oxide, and the source electrode film 82 contains, for example, polysilicon doped with an impurity. A channel 20 of a columnar portion CL is in contact with, not the substrate 10, but the source electrode film 82. The source electrode film 82 is insulated from the substrate 10 by the interlayer insulating film 81. Further, the source electrode film 82 is provided in common to a plurality of stacked bodies, and is, for example, further connected to a lower layer source line (not shown).

In an upper layer portion of the substrate 10 and the interlayer insulating film 81, a subcell circuit 90 is provided. The subcell circuit 90 is a part of a driving circuit which performs writing, reading, and erasing of data with respect to a memory cell MC, and includes, for example, a sense amplifier.

For example, the upper layer portion of the substrate 10 is divided into a plurality of active areas by an STI (Shallow Trench Isolation) 84, and in some active areas, an n-type MOSFET (Metal-Oxide-Semiconductor Field-Effect Transistor) 85 is formed, and in the other active areas, a p-type MOSFET 86 is formed. Further, in the interlayer insulating film 81, wirings 87 are provided in multiple stages, and a contact 88 for connecting the wiring 87 to the substrate 10, and a via 89 for connecting the wirings 87 to each other are also provided. Incidentally, the n-type MOSFET 85, the p-type MOSFET 86, the wirings 87, etc. in FIG. 18 are illustrated schematically, and the sizes and arrangement thereof do not necessarily match the sizes and arrangement of the actual elements.

In the slit ST of the semiconductor memory device 3, the interconnect portion 18 described with reference to FIG. 1 is not provided, and also the lower layer source line SL1 and the upper layer source line SL2 to be connected to the interconnect portion 18 are not provided. In the slit ST, for example, an insulating body (not shown) is buried. To the source electrode film 82, a potential necessary for driving is supplied from the subcell circuit 90.

In the embodiment, the subcell circuit 90 is provided between the substrate 10 and the stacked body 15. Since a space between the substrate 10 and the stacked body 15 can be effectively utilized, and therefore, an area of a circuit disposed around the stacked body 15 can be reduced by that amount.

Third Embodiment

Figure 19:
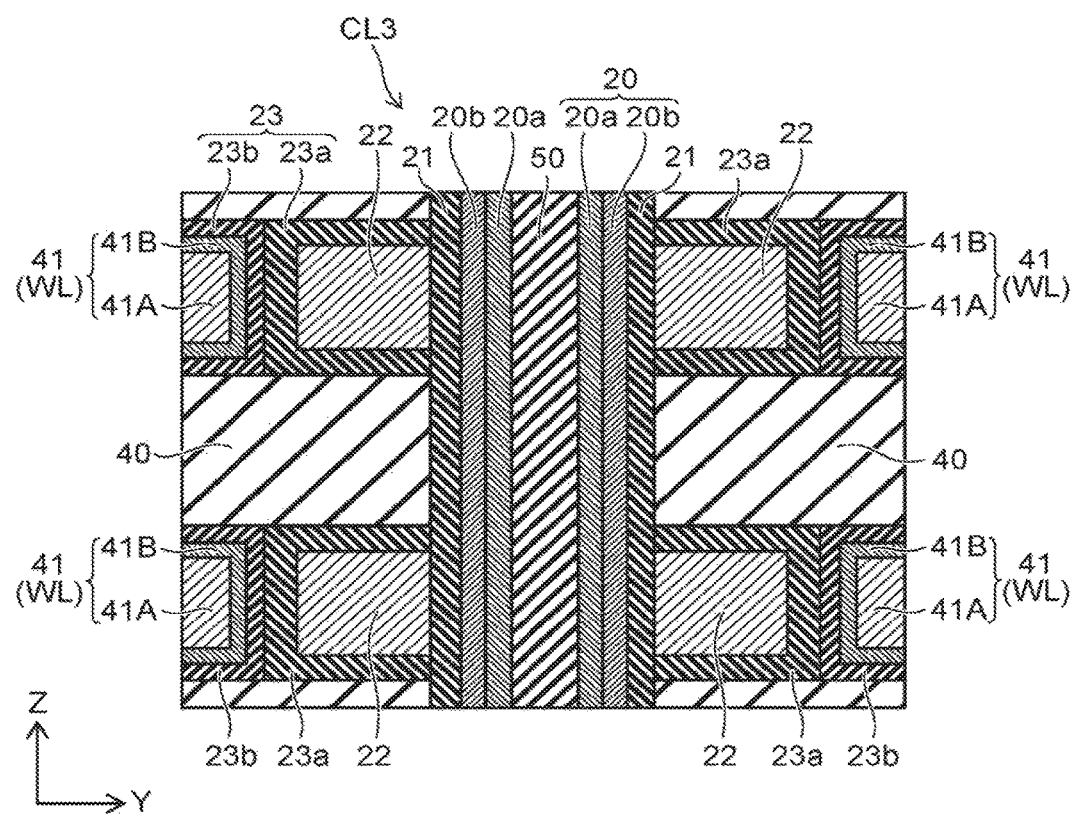
FIG. 19 is a sectional view showing a part of a semiconductor memory device according to a third embodiment.

FIG. 19 is a sectional view showing a part of a semiconductor memory device according to a third embodiment.

FIG. 19 is a Y-Z sectional view of a columnar portion CL3 in an enlarged manner.

As shown in FIG. 19, in a semiconductor memory device 4 according to the embodiment, a plurality of charge storage films 22 is provided for each electrode layer 41 unlike the configuration of the columnar portion CL (see FIG. 3) according to the first embodiment described above.

A columnar portion CL3 includes a core portion 50, a channel 20, and a tunnel insulating film 21. The channel 20 includes a body 20*a* and a cover layer 20*b*. A plurality of charge storage films 22 is provided for each electrode layer 41. The charge storage films 22 are stacked through an insulating layer 40. The charge storage films 22 contain, for example, silicon.

Also, a plurality of insulating films 23*a* is provided in the same manner as the charge storage films 22. The insulating film 23*a* is provided between the charge storage film 22 and the insulating film 23*b*, and between the insulating layer 40 and the charge storage film 22.

Incidentally, an effect of the embodiment is the same as that of the above-mentioned first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a substrate;
   a stacked body provided on the substrate and including a plurality of electrode layers separately stacked each other;
   a plurality of columnar portions provided in the stacked body, each of the plurality of columnar portions including a semiconductor portion extending in a stacking direction of the plurality of electrode layers and a charge storage film provided between the semiconductor portion and the stacked body; and
   an interconnect portion provided in the stacked body and extending in the stacking direction and a first direction crossing the stacking direction,
   the interconnect portion including a first portion located in a first region of the stacked body that the plurality of columnar portions is provided and a second portion located in a second region of the stacked body adjacent to the first region in the first direction, the first portion having a first width, the second portion having a second width larger than the first width.

2. The device according to claim 1, wherein the plurality of columnar portions is not provided in the second region.

3. The device according to claim 2, wherein
   the plurality of electrode layers extends in the first direction, and
   the plurality of electrode layers includes a first electrode portion located in the first region and having a third width in a second direction crossing the stacking direction and the first direction, and a second electrode portion located in the second region and having a fourth width not smaller than the third width in the second direction.

4. The device according to claim 3, wherein in a cross section parallel to the stacking direction and the second direction, a sectional area of the second electrode portion is not smaller than a sectional area of the first electrode portion.

5. The device according to claim 1, wherein
   the first portion and the second portion of the interconnect portion each include a first conductive portion and a second conductive portion, the second conductive portion being provided on the first conductive portion and containing a material different from a material of the first conductive portion, and
   in the second portion, the first conductive portion covers a part of the second conductive portion.

6. The device according to claim 5, wherein
   the first conductive portion contains silicon, and
   the second conductive portion contains tungsten.

7. The device according to claim 1, wherein
   the first portion of the interconnect portion includes a first insulating portion and a third conductive portion provided on the first insulating portion, and
   the second portion of the interconnect portion includes a fourth conductive portion containing a same material as a material of the third conductive portion.

8. The device according to claim 7, wherein
   the first insulating portion contains silicon oxide, and
   the third conductive portion contains tungsten.

9. The device according to claim 1, further comprising a contact portion provided on the interconnect portion in the second region.

10. The device according to claim 9, wherein the contact portion is provided on the second portion of the interconnect portion.

11. A semiconductor memory device, comprising:
    a substrate;
    a stacked body provided on the substrate and including a plurality of electrode layers separately stacked each other; and
    at least one interconnect portion provided in the stacked body, extending in a stacking direction of the plurality of electrode layers and a first direction crossing the stacking direction, and including a first convex portion protruding in a second direction crossing the stacking direction and the first direction.

12. The device according to claim 11, wherein
the device further comprises a plurality of columnar portions provided in the stacked body, each of the plurality of columnar portions including a semiconductor portion extending in the stacking direction and a charge storage film provided between the semiconductor portion and the stacked body, and
the first convex portion is located in a first region of the stacked body disposed at a predetermined interval in the first direction, the plurality of columnar portions being not provided in the first region.

13. The device according to claim 11, wherein
a plurality of the interconnect portions is disposed along the second direction,
in two adjacent interconnect portions, at least one interconnect portion has a second convex portion protruding in an opposite direction to the second direction, and
the first convex portion provided in one interconnect portion faces the second convex portion provided in the other interconnect portion.

14. The device according to claim 11, wherein
the interconnect portion includes a first conductive portion and a second conductive portion containing a material different from a material of the first conductive portion, and
the first conductive portion is provided along an inner wall surface and a bottom surface of the first convex portion and covers the second conductive portion.

15. The device according to claim 11, further comprising a contact portion provided on the first convex portion of the interconnect portion.

16. A semiconductor memory device, comprising:
a substrate;
a stacked body provided on the substrate and including a plurality of electrode layers separately stacked each other;
a plurality of columnar portions provided in the stacked body, each of the plurality of columnar portions including a semiconductor portion extending in a stacking direction of the plurality of electrode layers and a charge storage film provided between the semiconductor portion and the stacked body; and
an interconnect portion provided in the stacked body and extending in the stacking direction and a first direction crossing the stacking direction, and in which
the interconnect portion includes a wide portion having a width expanding in a second direction crossing the stacking direction and the first direction in a first region of the stacked body disposed at a predetermined interval in the first direction, the plurality of columnar portions being not provided in the first region.

17. The device according to claim 16, wherein
the wide portion of the interconnect portion includes a first conductive portion and a second conductive portion containing a material different from a material of the first conductive portion, and
the first conductive portion covers a part of the second conductive portion.

18. The device according to claim 17, wherein
the first conductive portion contains silicon, and
the second conductive portion contains tungsten.

19. The device according to claim 16, further comprising a contact portion provided on the interconnect portion in the first region.

20. The device according to claim 19, wherein the contact portion is provided on the wide portion of the interconnect portion.

* * * * *